United States Patent
Huang

(10) Patent No.: US 12,489,072 B2
(45) Date of Patent: *Dec. 2, 2025

(54) SEMICONDUCTOR DEVICE WITH AIR GAP AND METHOD FOR PREPARING THE SAME

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 425 days.

This patent is subject to a terminal disclaimer.

(21) Appl. No.: 17/986,314

(22) Filed: Nov. 14, 2022

(65) Prior Publication Data

US 2024/0162174 A1 May 16, 2024

(51) Int. Cl.
*H01L 23/00* (2006.01)

(52) U.S. Cl.
CPC .............. *H01L 24/05* (2013.01); *H01L 24/03* (2013.01); *H01L 24/45* (2013.01); *H01L 24/85* (2013.01);
(Continued)

(58) Field of Classification Search
CPC .. H10D 62/115; H10D 62/116; H10D 64/687; H10D 64/679; H01L 24/02; H01L 24/03; H01L 24/05; H01L 24/06; H01L 24/45; H01L 24/48; H01L 24/85; H01L 24/18; H01L 24/19; H01L 24/20; H01L 21/764; H01L 21/7682; H01L 21/76895; H01L 21/76897; H01L 21/76804; H01L 21/76805; H01L 21/76816; H01L 21/76877; H01L 21/823475; H01L 21/823871; H01L 2221/1042; H01L 2221/1043; H01L 2221/1044; H01L 2221/1045; H01L 2221/1046; H01L 2221/1047; H01L 2224/0401; H01L 2224/04042; H01L 2224/85; H01L 2224/02125; H01L 23/5226; H01L 23/5283; H01L 23/5286; H01L 23/481; H01L 23/535; H01L 23/5384; H01L 53/5386; H01L 25/0657; H01L 25/50;
(Continued)

(56) References Cited

U.S. PATENT DOCUMENTS

2021/0287937 A1* 9/2021 Shih ................... H01L 21/7682
2024/0162177 A1* 5/2024 Huang ................... H01L 24/48

FOREIGN PATENT DOCUMENTS

TW 202141719 A 11/2021

* cited by examiner

*Primary Examiner* — Wael M Fahmy
*Assistant Examiner* — Thomas Wilson McCoy
(74) *Attorney, Agent, or Firm* — MUNCY, GEISSLER, OLDS & LOWE, P.C.

(57) ABSTRACT

A semiconductor device includes an interconnect structure disposed over a semiconductor substrate. The interconnect structure includes a first interconnect portion and a second interconnect portion. The semiconductor device also includes a first porous dielectric portion disposed between the first interconnect portion and the second interconnect portion, and a dielectric layer surrounding the first porous dielectric portion. The semiconductor device further includes a bonding pad disposed over the dielectric layer and the first porous dielectric portion. The bonding pad and the first porous dielectric portion are separated by a first air gap.

12 Claims, 23 Drawing Sheets

(52) U.S. Cl.
CPC .......... *H01L 2224/0215* (2013.01); *H01L 2224/02373* (2013.01); *H01L 2224/03011* (2013.01); *H01L 2224/04042* (2013.01); *H01L 2224/05569* (2013.01); *H01L 2224/05624* (2013.01); *H01L 2224/05647* (2013.01); *H01L 2224/05666* (2013.01); *H01L 2224/05681* (2013.01); *H01L 2224/05684* (2013.01); *H01L 2224/05686* (2013.01); *H01L 2224/85* (2013.01)

(58) Field of Classification Search
CPC . H01L 2224/80895; H01L 2224/80896; H01L 2224/08111; H01L 2224/08112; H01L 2224/08145–08148; H05H 1/2441
See application file for complete search history.

SEMICONDUCTOR DEVICE WITH AIR GAP AND METHOD FOR PREPARING THE SAME

TECHNICAL FIELD

The present disclosure relates to a semiconductor device and a method for preparing the same, and more particularly, to a semiconductor device with an air gap and a method for preparing the same.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, wafer level chip scale packaging (WLCSP) is widely used for its low cost and relatively simple processes. Furthermore, numerous manufacturing operations are implemented within such small semiconductor devices.

However, the manufacturing and integration of semiconductor devices involve many complicated steps and operations. An increase in the complexity of manufacturing and integration of semiconductor devices may cause deficiencies. Accordingly, there is a continuous need to improve the manufacturing process of semiconductor devices so that the problems can be addressed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device is provided. The semiconductor device includes an interconnect structure disposed over a semiconductor substrate. The interconnect structure includes a first interconnect portion and a second interconnect portion. The semiconductor device also includes a first porous dielectric portion disposed between the first interconnect portion and the second interconnect portion, and a dielectric layer surrounding the first porous dielectric portion. The semiconductor device further includes a bonding pad disposed over the dielectric layer and the first porous dielectric portion. The bonding pad and the first porous dielectric portion are separated by a first air gap.

In an embodiment, a top surface of the dielectric layer is higher than a top surface of the first porous dielectric portion. In an embodiment, a top surface of the first porous dielectric portion is higher than a top surface of the first interconnect portion and a top surface of the second interconnect portion. In an embodiment, the semiconductor device further includes a second porous dielectric portion disposed over the first interconnect portion, wherein the bonding pad and the second porous dielectric portion are separated by a second air gap.

In an embodiment, the semiconductor device further includes a first conductive via and a second conductive via disposed between and electrically connecting the bonding pad and the first interconnect portion, wherein the second porous dielectric portion is disposed between the first conductive via and the second conductive via. In an embodiment, the semiconductor device further includes a third porous dielectric portion disposed over the second interconnect portion, wherein the bonding pad and the third porous dielectric portion are separated by a third air gap.

In an embodiment, the semiconductor device further includes a third conductive via and a fourth conductive via disposed between and electrically connecting the bonding pad and the second interconnect portion, wherein the third porous dielectric portion is disposed between the third conductive via and the fourth conductive via. In an embodiment, the semiconductor device further includes a passivation layer disposed over the bonding pad, wherein the bonding pad is partially exposed by an opening in the passivation layer. In an embodiment, the opening in the passivation layer overlaps the first air gap in a top view. In an embodiment, the passivation layer does not overlap the first air gap in the top view.

In another embodiment of the present disclosure, a semiconductor device is provided. The semiconductor device includes an interconnect structure disposed over a semiconductor substrate. The interconnect structure includes a first interconnect portion and a second interconnect portion. The semiconductor device also includes a first porous dielectric portion disposed over and in direct contact with the first interconnect portion of the interconnect structure, and a dielectric layer surrounding the first porous dielectric portion and covering the interconnect structure. The semiconductor device further includes a bonding pad disposed over the dielectric layer and the first porous dielectric portion. The bonding pad and the first porous dielectric portion of the interconnect structure are separated by a first air gap.

In an embodiment, a top surface of the dielectric layer is higher than a top surface of the first porous dielectric portion, and the bonding pad is in direct contact with the top surface of the dielectric layer. In an embodiment, the semiconductor device further includes a first conductive via and a second conductive via disposed between and electrically connecting the bonding pad and the first interconnect portion of the interconnect structure, wherein the first porous dielectric portion is disposed between and in direct contact with the first conductive via and the second conductive via. In an embodiment, the semiconductor device further includes a second porous dielectric portion disposed over and in direct contact with the second interconnect portion of the interconnect structure, wherein the bonding pad and the second porous dielectric portion of the interconnect structure are separated by a second air gap.

In an embodiment, the first porous dielectric portion is separated from the second porous dielectric portion, and the first air gap is separated from the second air gap. In an embodiment, the semiconductor device further includes a third conductive via and a fourth conductive via disposed between and electrically connecting the bonding pad and the second interconnect portion of the interconnect structure, wherein the second porous dielectric portion is disposed between and in direct contact with the third conductive via and the fourth conductive via. In an embodiment, the semiconductor device further includes a third porous dielectric portion surrounded by the dielectric layer, wherein the third porous dielectric portion is disposed between the first porous dielectric portion and the second porous dielectric portion, and wherein the bonding pad and the third porous dielectric portion are separated by a third air gap.

In an embodiment, the first porous dielectric portion, the second porous dielectric portion, and the third porous dielectric portion include a porous low-k dielectric material. In an embodiment, the semiconductor device further includes a passivation layer disposed over the bonding pad, wherein the bonding pad is partially exposed by an opening in the passivation layer. In addition, the semiconductor device includes a wire bond physically bonded to the bonding pad through the opening, wherein the wire bond overlaps the third air gap in a top view. In an embodiment, the bonding pad includes a protruding portion extending toward the third porous dielectric portion.

In yet another embodiment of the present disclosure, a method for forming a semiconductor device is provided. The method includes forming an interconnect structure over a semiconductor substrate. The interconnect structure includes a first interconnect portion and a second interconnect portion. The method also includes forming a dielectric layer over the semiconductor substrate and covering the interconnect structure, and forming a first opening penetrating through the dielectric layer. The first opening is between the first interconnect portion and the second interconnect portion of the interconnect structure. The method further includes filling the first opening with a first porous dielectric portion, and forming a bonding pad over the dielectric layer and the first porous dielectric portion. In addition, the method includes performing a heat treatment process to form a first air gap between the first porous dielectric portion and the bonding pad.

In an embodiment, the bonding pad is in direct contact with the first porous dielectric portion before the heat treatment process is performed. In an embodiment, the bonding pad is separated from the first porous dielectric portion by the first air gap after the heat treatment process is performed. In an embodiment, before the bonding pad is formed, the method further includes forming a second opening in the dielectric layer to partially expose the first interconnect portion of the interconnect structure, and filling the second opening with a second porous dielectric portion, wherein the second porous dielectric portion and the first porous dielectric portion include a porous low-k dielectric material.

In an embodiment, the bonding pad extends over and in direct contact with the second porous dielectric portion before the heat treatment process is performed. In an embodiment, the bonding pad is separated from the second porous dielectric portion by a second air gap after the heat treatment process is performed. In an embodiment, before the bonding pad is formed, the method further includes forming a first via hole and a second via hole in the dielectric layer to partially expose the first interconnect portion of the interconnect structure, wherein the first via hole and the second via hole expose opposite sidewalls of the second porous dielectric portion. In addition, the method includes filling the first via hole and the second via hole with a first conductive via and a second conductive via, respectively.

In an embodiment, the method further includes forming a passivation layer covering the bonding pad, and forming a third opening in the passivation layer to expose a portion of the bonding pad. In an embodiment, the portion of the bonding pad exposed by the third opening overlaps the first air gap in a top view. In an embodiment, the method further includes performing a bonding process to attach a wire bond to the bonding pad through the third opening, wherein a protruding portion extending toward the first porous dielectric portion is formed after the bonding process is performed.

Embodiments of a semiconductor device with an air gap and method for preparing the same are provided in the disclosure. In some embodiments, the semiconductor device includes a porous dielectric portion disposed between a semiconductor substrate and a bonding pad. In some embodiments, the bonding pad is separated from the porous dielectric portion by an air gap, and a wire bond is attached to the bonding pad by a bonding process. During the bonding process, the air gap acts as a cushion to reduce the impact of the stress from the wire bond on the underlying structure. As a result, the performance, reliability and yield of the semiconductor device can be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
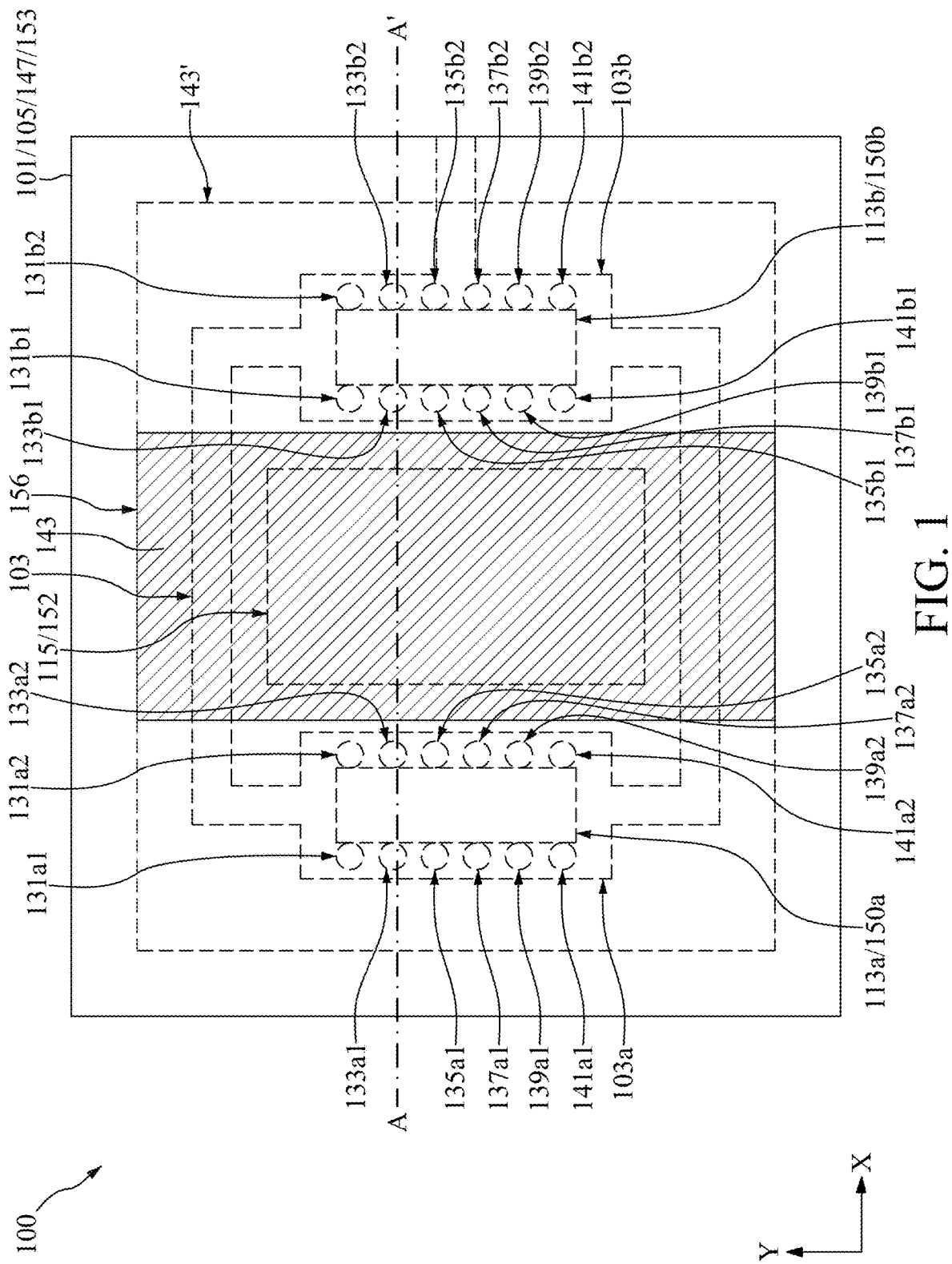
FIG. 1 is a top view illustrating a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
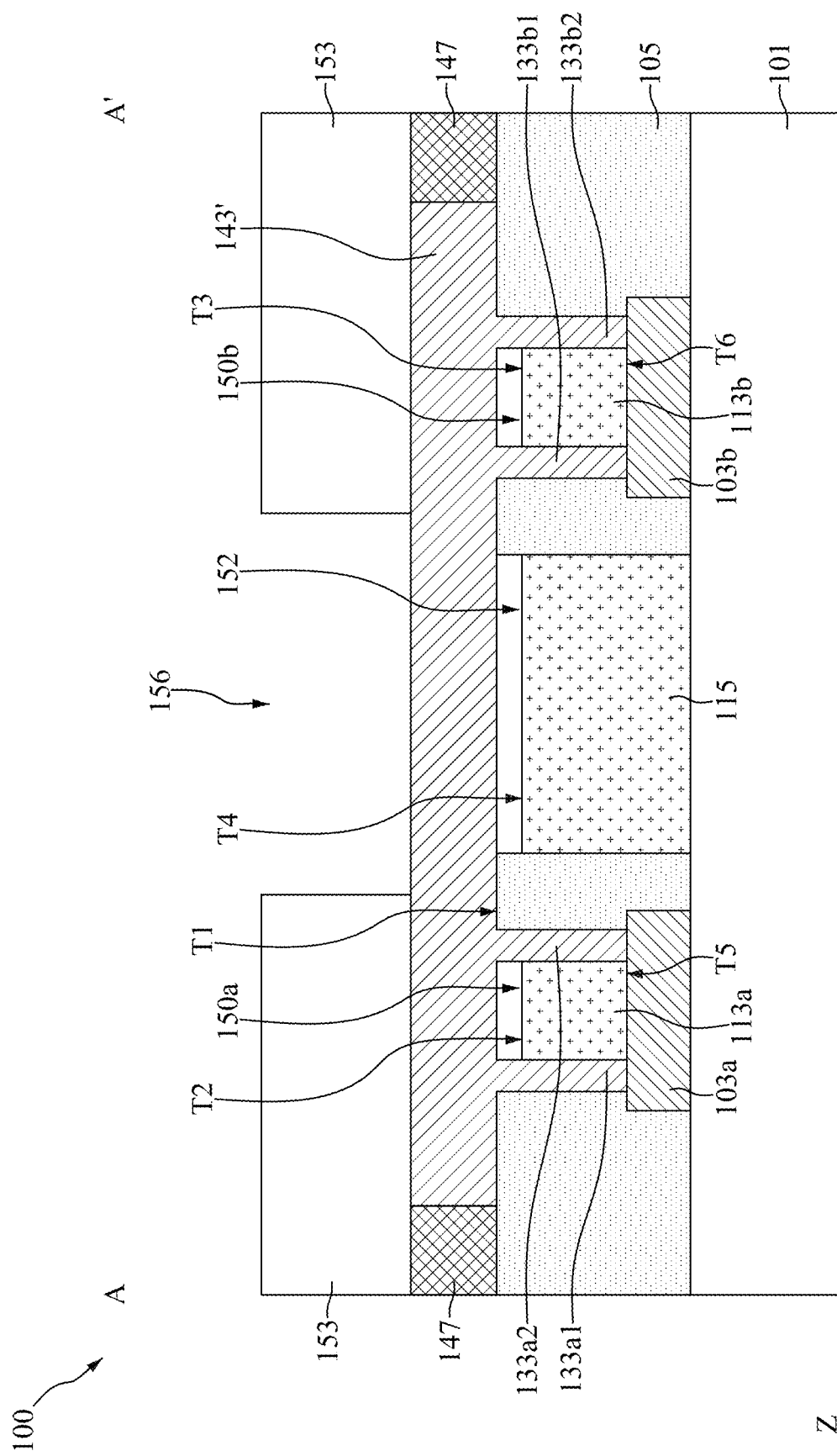
FIG. 2 is a cross-sectional view illustrating the semiconductor device along the sectional line A-A' in FIG. 1, in accordance with some embodiments.

FIG. 1 is a top view illustrating a semiconductor device 100, and FIG. 2 is a cross-sectional view illustrating the semiconductor device 100 along the sectional line A-A' in FIG. 1, in accordance with some embodiments. In some embodiments, the semiconductor device 100 includes a semiconductor substrate 101, and an interconnect structure 103 disposed over the semiconductor substrate 101. In some embodiments, the interconnect structure 103 includes an interconnect portion 103a (also referred to as a first interconnect portion) and an interconnect portion 103b (also referred to as a second interconnect portion) arranged along the X direction, and the interconnect portions 103 and 103b are physically and electrically connected by other portions of the interconnect structure 103. In some embodiments, the interconnect structure 103 has a rectangular ring shape from the top view. However, the shape of the interconnect structure 103 from the top view may be any other shape.

In some embodiments, the semiconductor device 100 also includes porous dielectric portions 113a, 113b, and 113c, and a dielectric layer 105 disposed over the semiconductor substrate 101. In some embodiments, the porous dielectric portion 113a is disposed over and in direct contact with the interconnect portion 103a, the porous dielectric portion 113b is disposed over and in direct contact with the interconnect portion 103b, and the porous dielectric portion 115 is disposed between the interconnect portions 103a and 103b. In some embodiments, the porous dielectric portion 115 is in direct contact with the semiconductor substrate 101, and the porous dielectric portions 113a and 113b are separated from the semiconductor substrate 101 by the interconnect portions 103a and 103b, respectively.

In addition, the interconnect structure 103 (including the interconnect portions 103a and 103b) and the porous dielectric portions 113a, 113b, and 115 are disposed in the dielectric layer 105. In some embodiments, the porous dielectric portions 113a, 113b, and 115 are surrounded by and in direct contact with the dielectric layer 105. In some embodiments, the interconnect structure 103 is covered by and in direct contact with the dielectric layer 105. In some embodiments, the porous dielectric portions 113a, 113b, and 115 include the same material, which is different from the material of the dielectric layer 105.

In some embodiments, the semiconductor device 100 further includes a bonding pad 143' disposed over the dielectric layer 105 and covering the porous dielectric portions 113a, 113b, and 115, and conductive vias 131a1, 131a2, 131b1, 131b2, 133a1, 133a2, 133b1, 133b2, 135a1, 135a2, 135b1, 135b2, 137a1, 137a2, 137b1, 137b2, 139a1, 139a2, 139b1, 139b2, 141a1, 141a2, 141b1, and 141b2 disposed between the bonding pad 143' and the interconnect structure 103. In some embodiments, the conductive vias 131a1, 131a2, 133a1, 133a2, 135a1, 135a2, 137a1, 137a2, 139a1, 139a2, 141a1, and 141a2 are disposed between and in direct contact with the bonding pad 143' and the interconnect portion 103a. In some embodiments, the bonding pad 143' and the interconnect portion 103a are electrically connected by the conductive vias 131a1, 131a2, 133a1, 133a2, 135a1, 135a2, 137a1, 137a2, 139a1, 139a2, 141a1, and 141a2.

Moreover, in some embodiments, the conductive vias 131b1, 131b2, 133b1, 133b2, 135b1, 135b2, 137b1, 137b2, 139b1, 139b2, 141b1, and 141b2 are disposed between and in direct contact with the bonding pad 143' and the interconnect portion 103b. In some embodiments, the bonding pad 143' and the interconnect portion 103b are electrically connected by the conductive vias 131b1, 131b2, 133b1, 133b2, 135b1, 135b2, 137b1, 137b2, 139b1, 139b2, 141b1, and 141b2. In some embodiments, the bonding pad 143' and the conductive vias 131a1, 131a2, 131b1, 131b2, 133a1, 133a2, 133b1, 133b2, 135a1, 135a2, 135b1, 135b2, 137a1, 137a2, 137b1, 137b2, 139a1, 139a2, 139b1, 139b2, 141a1, 141a2, 141b1, 141b2 are formed from the same material(s) with the same process step(s).

In addition, the semiconductor device 100 includes a molding layer 147 surrounding the bonding pad 143', and a passivation layer 153 disposed over the bonding pad 143', in accordance with some embodiments. In some embodiments, air gaps 150a, 150b, and 152 are formed during the heat treatment process used to form the molding layer 147. In some embodiments, the air gap 150a is formed between the porous dielectric portion 113a and the bonding pad 143', the air gap 150b is formed between the porous dielectric portion 113b and the bonding pad 143', and the air gap 152 is formed between the porous dielectric portion 115 and the bonding pad 143'.

In some embodiments, the bonding pad 143' is separated from the porous dielectric portions 113a, 113b, 115 by the air gaps 150a, 150b, 152, respectively. As shown in FIG. 2, the top surface T1 of the dielectric layer is higher than the top surface T2 of the porous dielectric portion 113a, the top surface T3 of the porous dielectric portion 113b, and the top surface T4 of the porous dielectric portion 115, in accordance with some embodiments. Moreover, the top surface T2 of the porous dielectric portion 113a, the top surface T3 of the porous dielectric portion 113b, and the top surface T4 of the porous dielectric portion 115 are higher than the top surface T5 of the interconnect portion 103a, and the top surface T6 of the interconnect portion 103b.

In some embodiments, the bonding pad 143' is partially exposed by an opening 156 penetrating through the passivation layer 153. In some embodiments, a bond element such as a wire bond is provided to the bonding pad 143' through the opening 156 in the subsequent bonding process. In some embodiments, the opening 156 overlaps the air gap 152 in the top view of FIG. 1. In some embodiments, the passivation layer 153 does not overlap the air gap 152 in the top view of FIG. 1.

Figure 3:
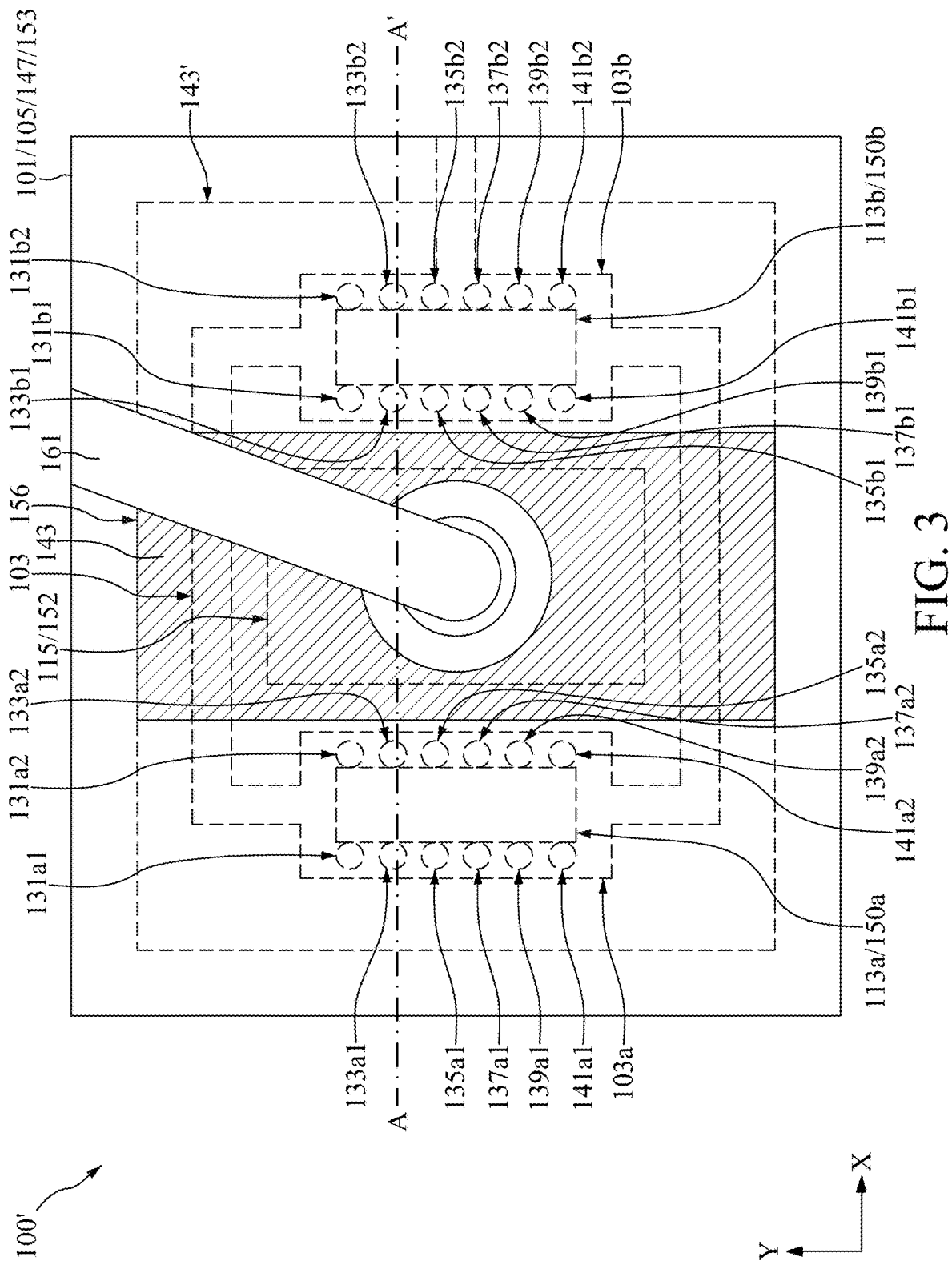
FIG. 3 is a top view illustrating a semiconductor device after performing a bonding process, in accordance with some embodiments.
Figure 4:
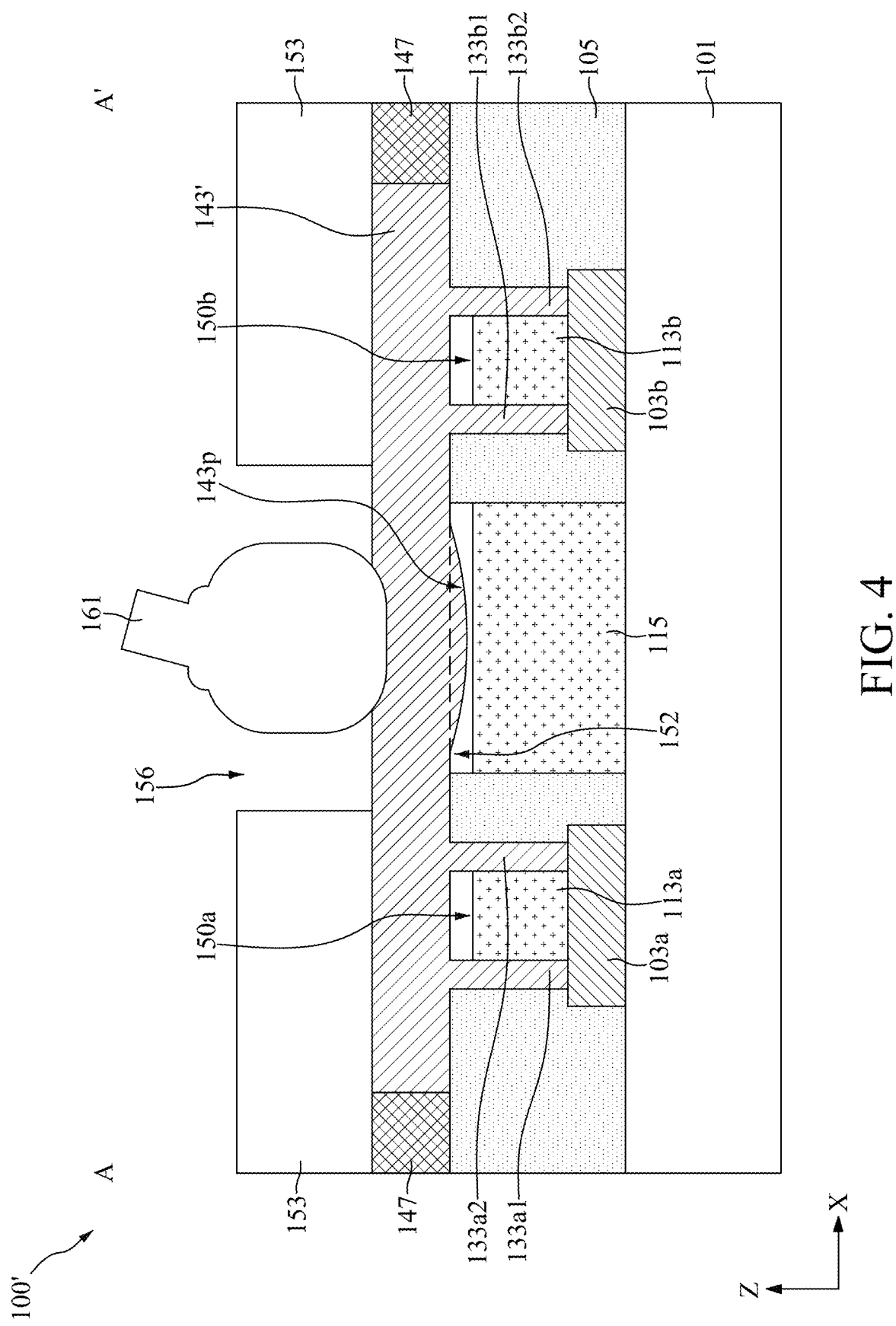
FIG. 4 is a cross-sectional view illustrating the semiconductor device along the sectional line A-A' in FIG. 3, in accordance with some embodiments.

FIG. 3 is a top view illustrating the semiconductor device 100 after performing a bonding process (referred to as the semiconductor device 100'), and FIG. 4 is a cross-sectional view illustrating the semiconductor device 100' along the sectional line A-A' in FIG. 3, in accordance with some embodiments. As mentioned above, after the semiconductor device 100 is formed, a bond element, such as a wire bond 161, is attached (or bonded) to the bonding pad 143' through the opening 156 in the passivation layer 153 during the bonding process, which causes a portion of the bonding pad 143' to be pushed downwardly, such that a protruding portion 143p extending from the bonding pad 143' to the porous dielectric portion 115 is obtained, in accordance with some embodiments.

In the present embodiment, the protruding portion 143p is separated from the porous dielectric portion 115 by a portion of the air gap 152. In alternative embodiments, the protruding portion 143p is in direct contact with the porous dielectric portion 115 after the bonding process. Since the air gaps 150a, 150b, and 152 covered by the bonding pad 143' provide adequate cushion for the structure of the semiconductor device 100' below the bonding pad 143' during the bonding process, the structure may by substantially intact. Within the context of this disclosure, the word "substantially" means preferably at least 90%, more preferably 95%, even more preferably 98%, and most preferably 99%.

Figure 5:
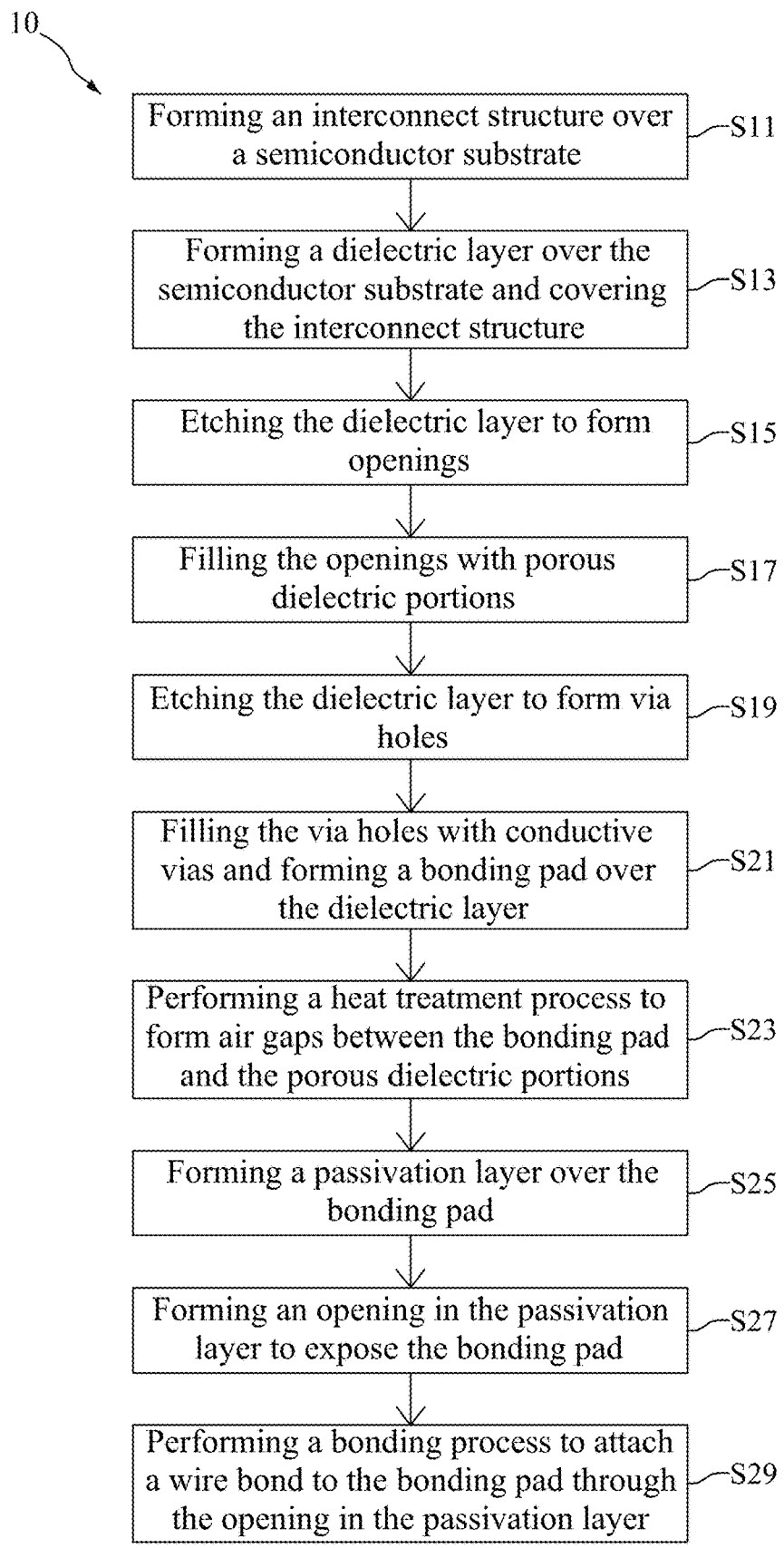
FIG. 5 is a flow diagram illustrating a method for forming a semiconductor device, in accordance with some embodiments.

FIG. 5 is a flow diagram illustrating a method 10 for forming a semiconductor device (e.g., the semiconductor device 100 or 100'), and the method 10 includes steps S11, S13, S15, S17, S19, S21, S23, S25, S27, and S29, in accordance with some embodiments. The steps S11 to S29 of FIG. 5 are elaborated in connection with the following figures.

FIGS. 6, 8, 10, 12, 14, 16, 18, 20, and 22 are top views illustrating intermediate stages during the formation of the semiconductor device 100, and FIGS. 7, 9, 11, 13, 15, 17, 19, 21, and 23 are cross-sectional views illustrating intermediate stages during the formation of the semiconductor device 100, in accordance with some embodiments. It should be noted that FIGS. 7, 9, 11, 13, 15, 17, 19, 21, and 23 are cross-sectional views taken along the sectional line A-A' of FIGS. 6, 8, 10, 12, 14, 16, 18, 20, and 22, respectively.

Figure 6:
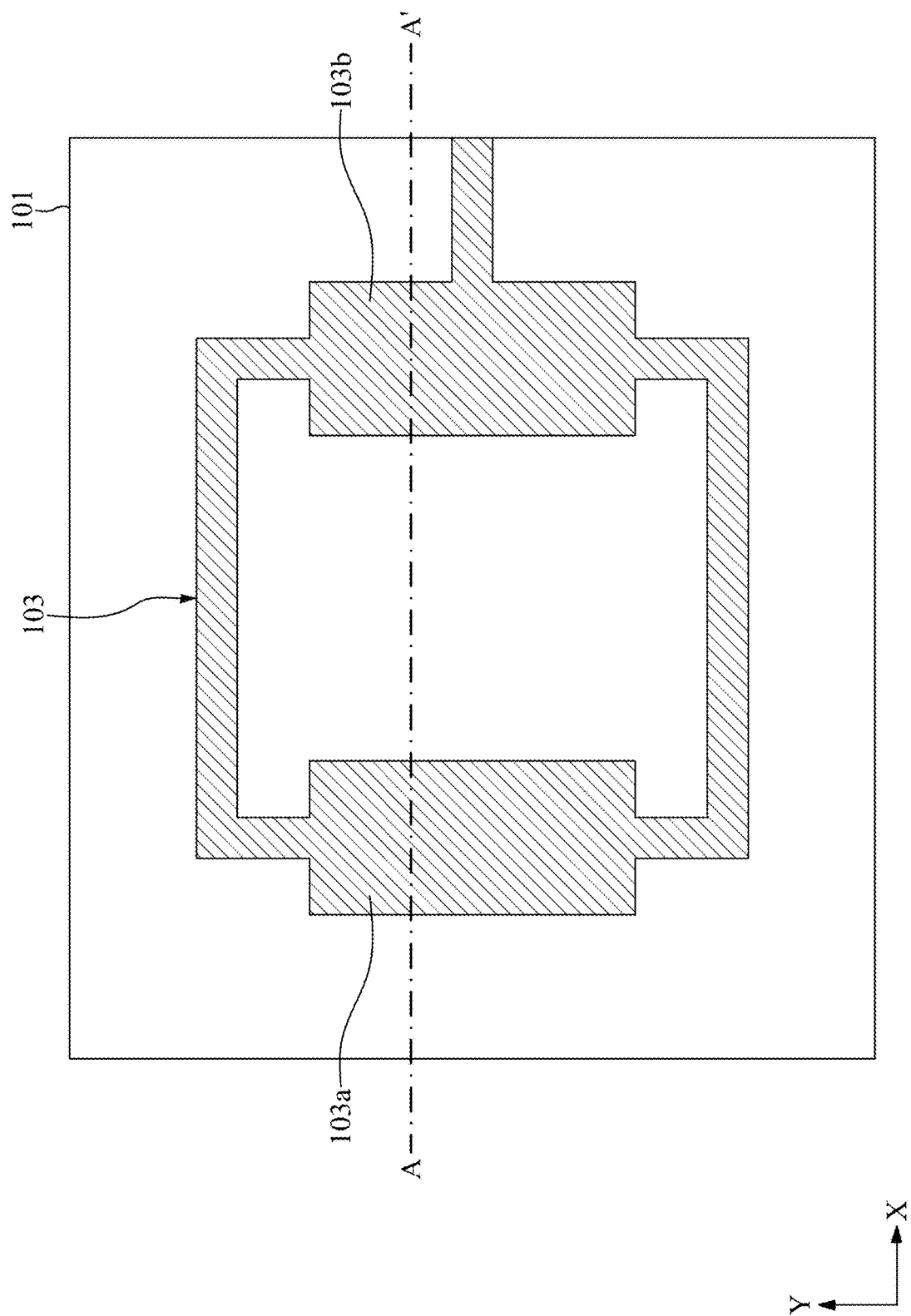
FIG. 6 is a top view illustrating an intermediate stage of forming an interconnect structure over a semiconductor substrate during the formation of the semiconductor device, in accordance with some embodiments.
Figure 7:
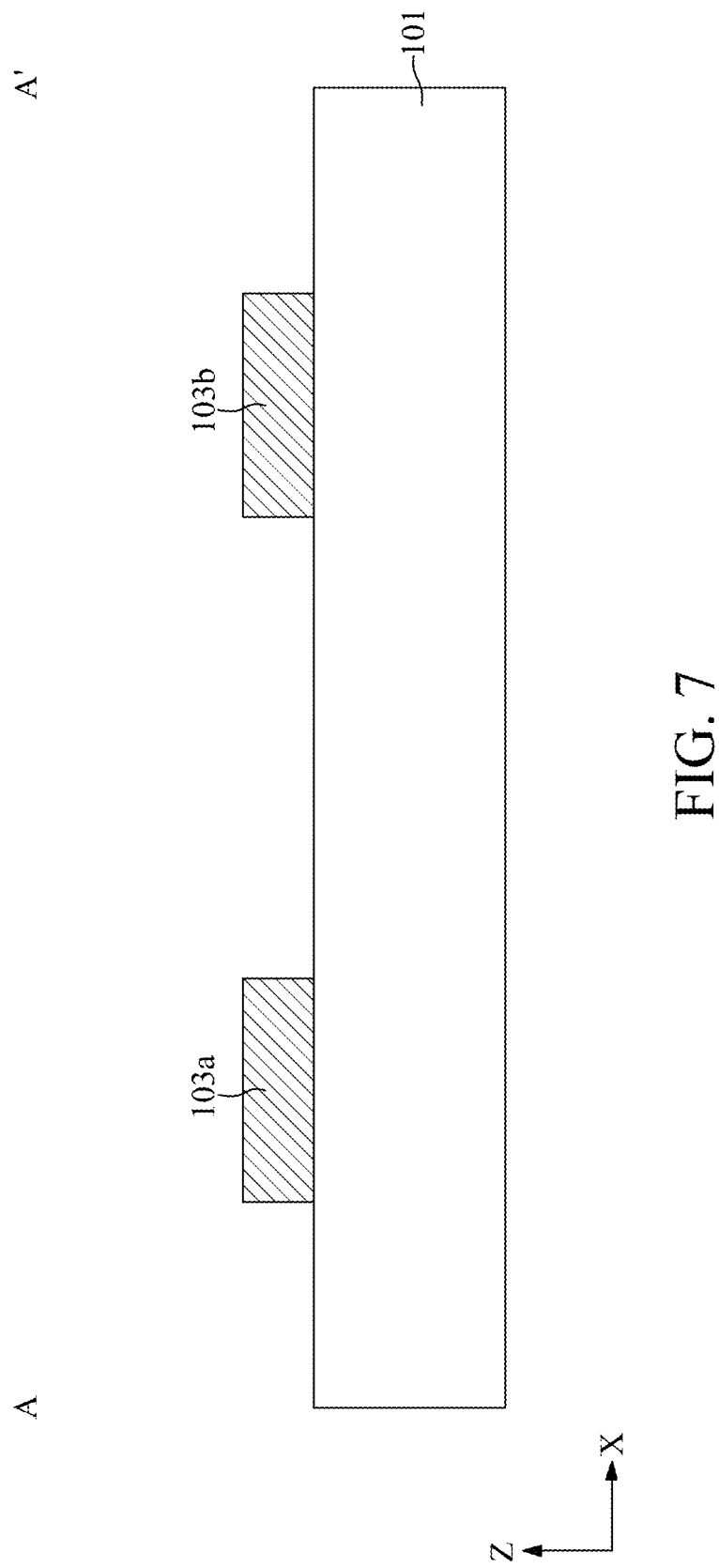
FIG. 7 is a cross-sectional view taken along the sectional line A-A' in FIG. 6, in accordance with some embodiments.

As shown in FIGS. 6 and 7, a semiconductor substrate 101 is provided. The semiconductor substrate 101 may be a semiconductor wafer such as a silicon wafer. Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

The semiconductor substrate 101 may include various passive and active microelectronic devices, such as resistors, capacitors, inductors, diodes, p-type field effect transistors (pFETs), n-type field effect transistors (nFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, fin field-effect transistors (FinFETs), other suitable integrated circuit (IC) components, or combinations thereof.

Moreover, the semiconductor substrate 101 may include various material layers (e.g., dielectric layers, semiconductor layers, and/or conductive layers) configured to form IC features (e.g., doped regions, isolation features, gate features, source/drain features, interconnect features, other features, or combinations thereof). The semiconductor substrate 101 has been simplified for the sake of clarity. It should be noted that additional features can be added in the semiconductor substrate 101, and some of the features described below can be replaced, modified, or eliminated in other embodiments.

Still referring to FIGS. 6 and 7, the interconnect structure 103 including the interconnect portions 103a and 103b is formed over the semiconductor substrate 101, in accordance with some embodiments. The respective step is illustrated as the step S11 in the method 10 shown in FIG. 5. The interconnect structure 103 may include a single layer structure or a multi-layer structure.

In some embodiments, the interconnect structure 103 includes a conductive material, such as copper (Cu), aluminum (Al), tungsten (W), titanium (Ti), titanium nitride (TiN), tantalum (Ta), tantalum nitride (TaN), or another suitable material. In some embodiments, the interconnect structure 103 is formed by a deposition process and a subsequent etching process. For example, the interconnect structure 103 is formed by depositing a conductive layer (not shown) over the semiconductor substrate 101, and etching the conductive layer to form the interconnect structure 103 using a patterned mask (not shown) as an etching mask. After the etching process, the patterned mask may be removed.

The deposition process includes a chemical vapor deposition (CVD) process, a physical vapor deposition (PVD) process, an atomic layer deposition (ALD) process, another suitable process, or a combination thereof. The etching process includes a wet etching process, a dry etching process, or a combination thereof. As shown in FIGS. 6 and 7, the interconnect portions 103*a* and 103*b* are arranged along the X direction, in accordance with some embodiments.

Figure 8:
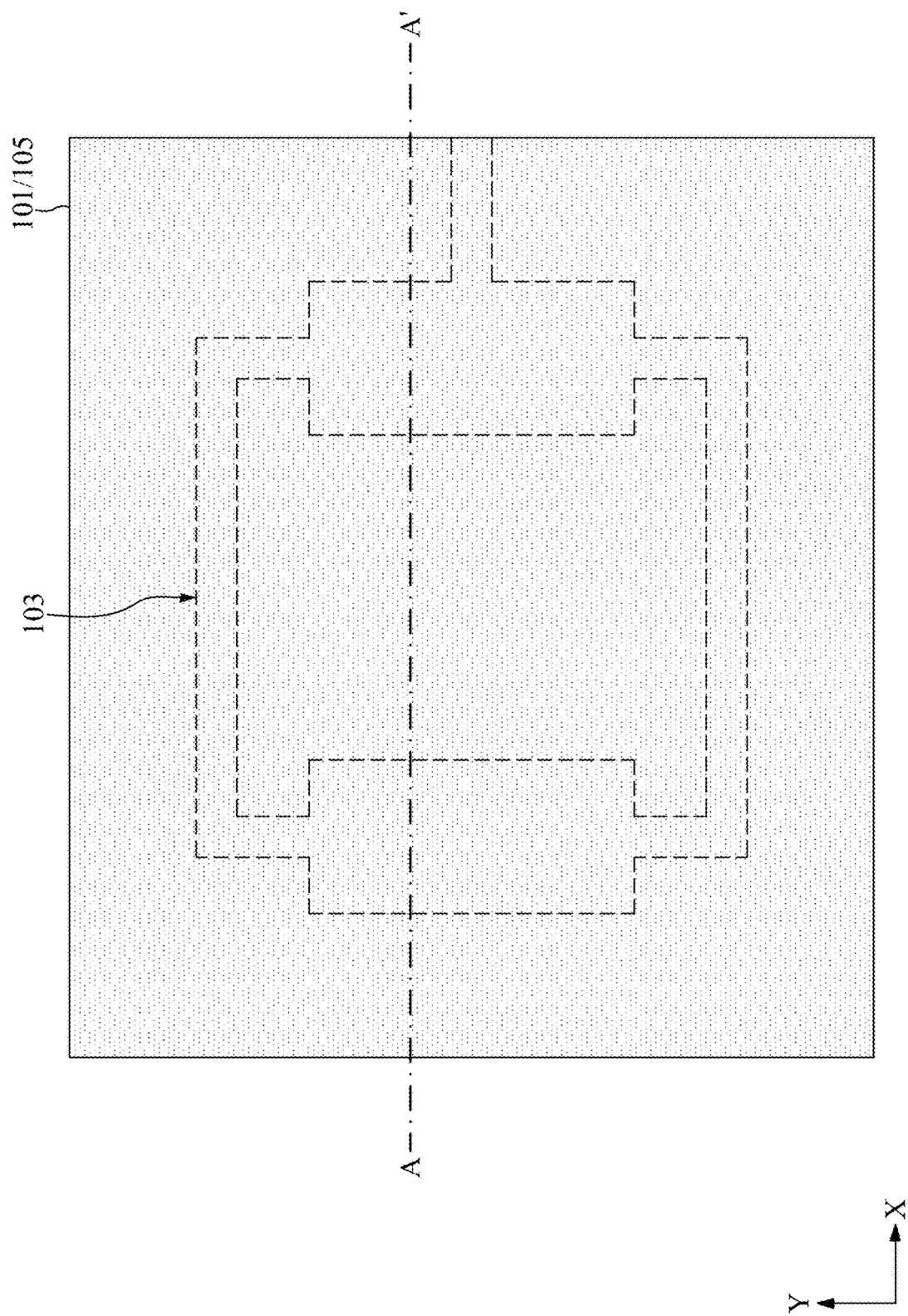
FIG. 8 is a top view illustrating an intermediate stage of forming a dielectric layer over the semiconductor substrate during the formation of the semiconductor device, in accordance with some embodiments.
Figure 9:
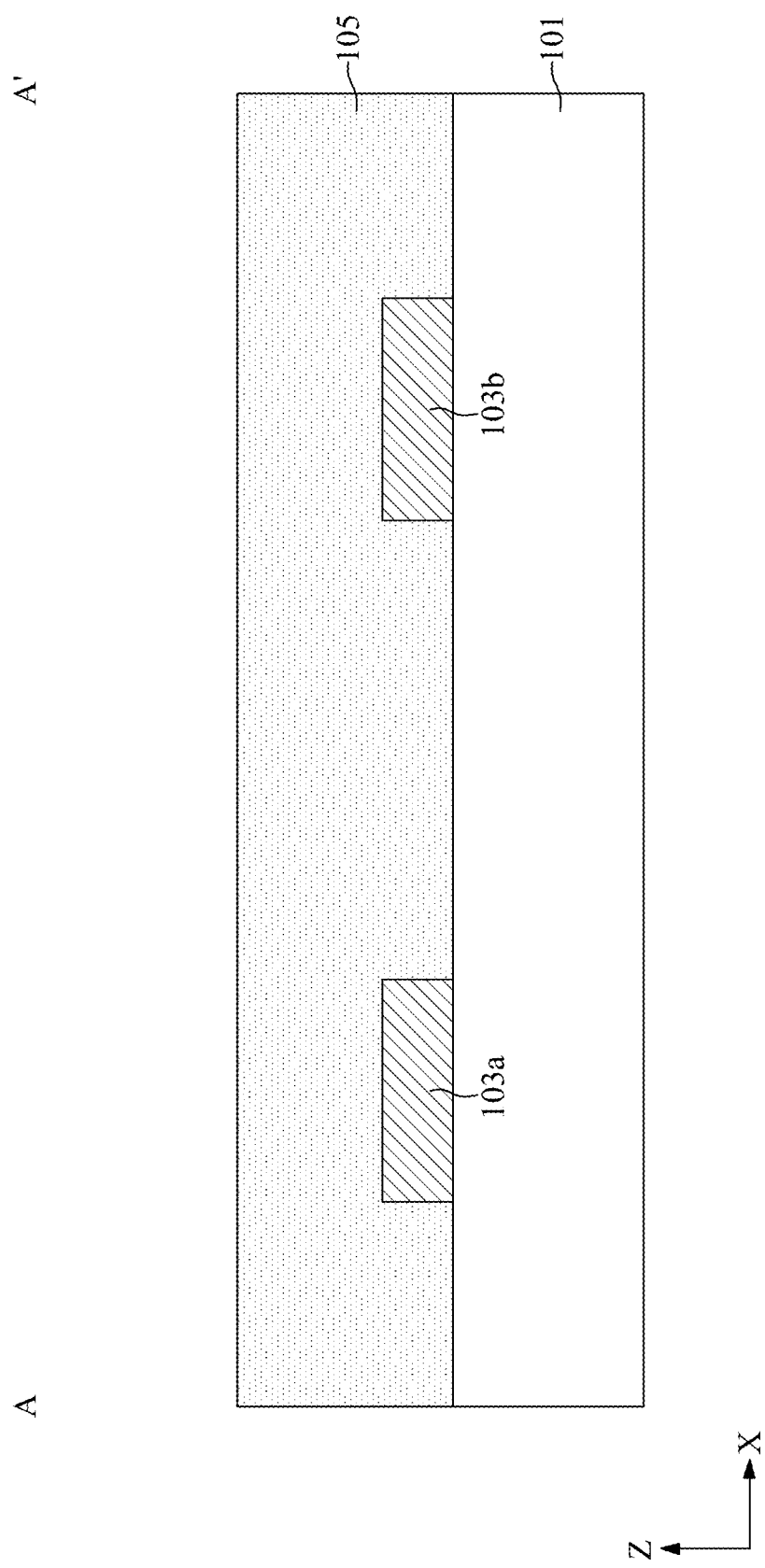
FIG. 9 is a cross-sectional view taken along the sectional line A-A' in FIG. 8, in accordance with some embodiments.

Next, a dielectric layer 105 is formed over the semiconductor substrate 101, and the interconnect structure 103 is covered by the dielectric layer 105, as shown in FIGS. 8 and 9 in accordance with some embodiments. The respective step is illustrated as the step S13 in the method 10 shown in FIG. 5. In some embodiments, the top surfaces and the sidewalls of the interconnect structure 103, and the top surface of the semiconductor substrate 101 exposed by the interconnect structure 103 are covered by the dielectric layer 105.

In some embodiments, the top surfaces and the sidewalls of the interconnect portions 103*a* and 103*b* are covered by and in direct contact with the dielectric layer 105. In some embodiments, the dielectric layer 105 includes silicon oxide, silicon nitride, silicon oxynitride, another suitable material, or a combination thereof. The dielectric layer 105 may be formed by a deposition process, such as a CVD process, a PVD process, an ALD process, a spin-coating process, or another suitable process. In addition, the dielectric layer 105 may be an inter-metal dielectric (IMD) layer.

Figure 10:
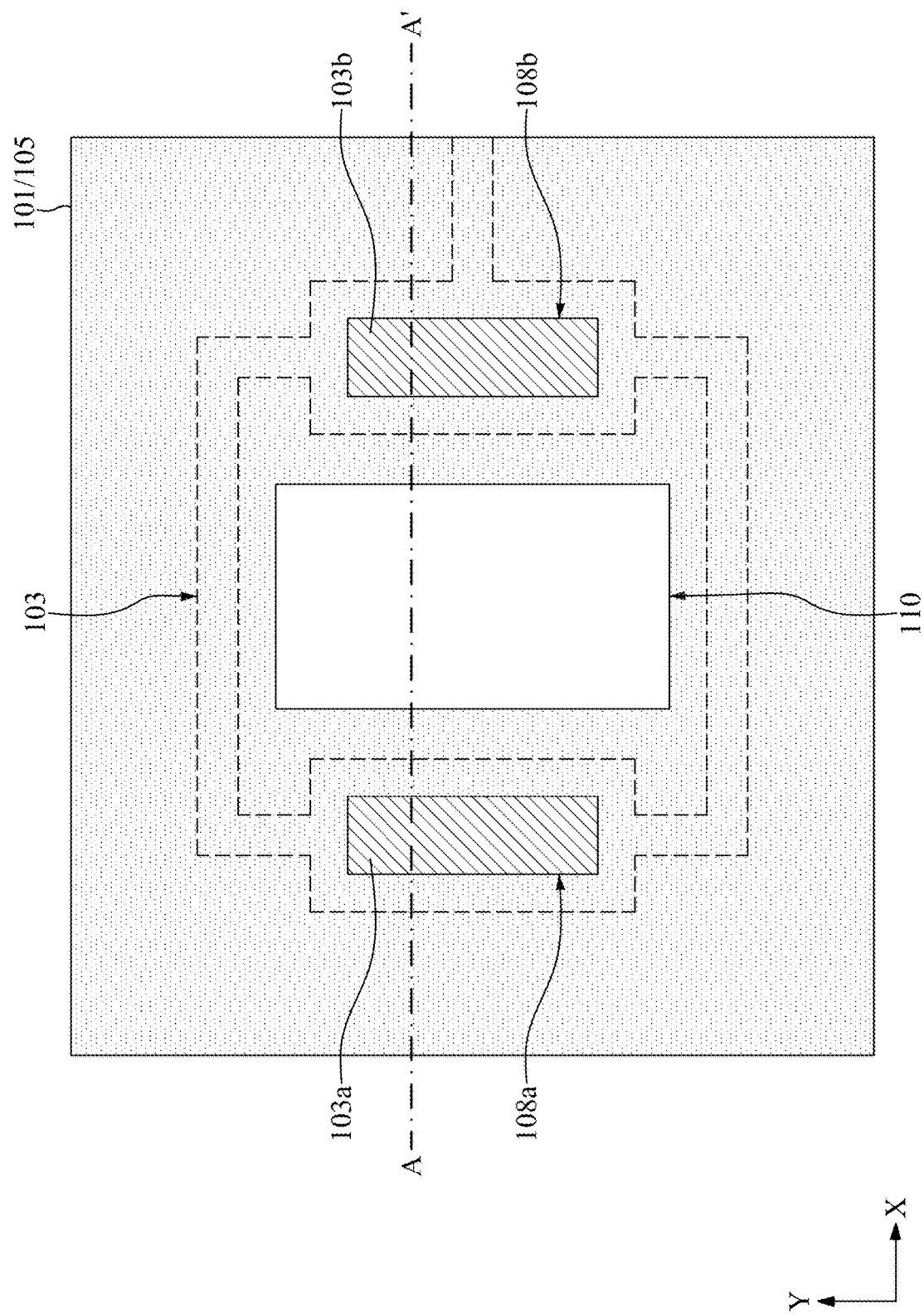
FIG. 10 is a top view illustrating an intermediate stage of etching the dielectric layer to form openings during the formation of the semiconductor device, in accordance with some embodiments.
Figure 11:
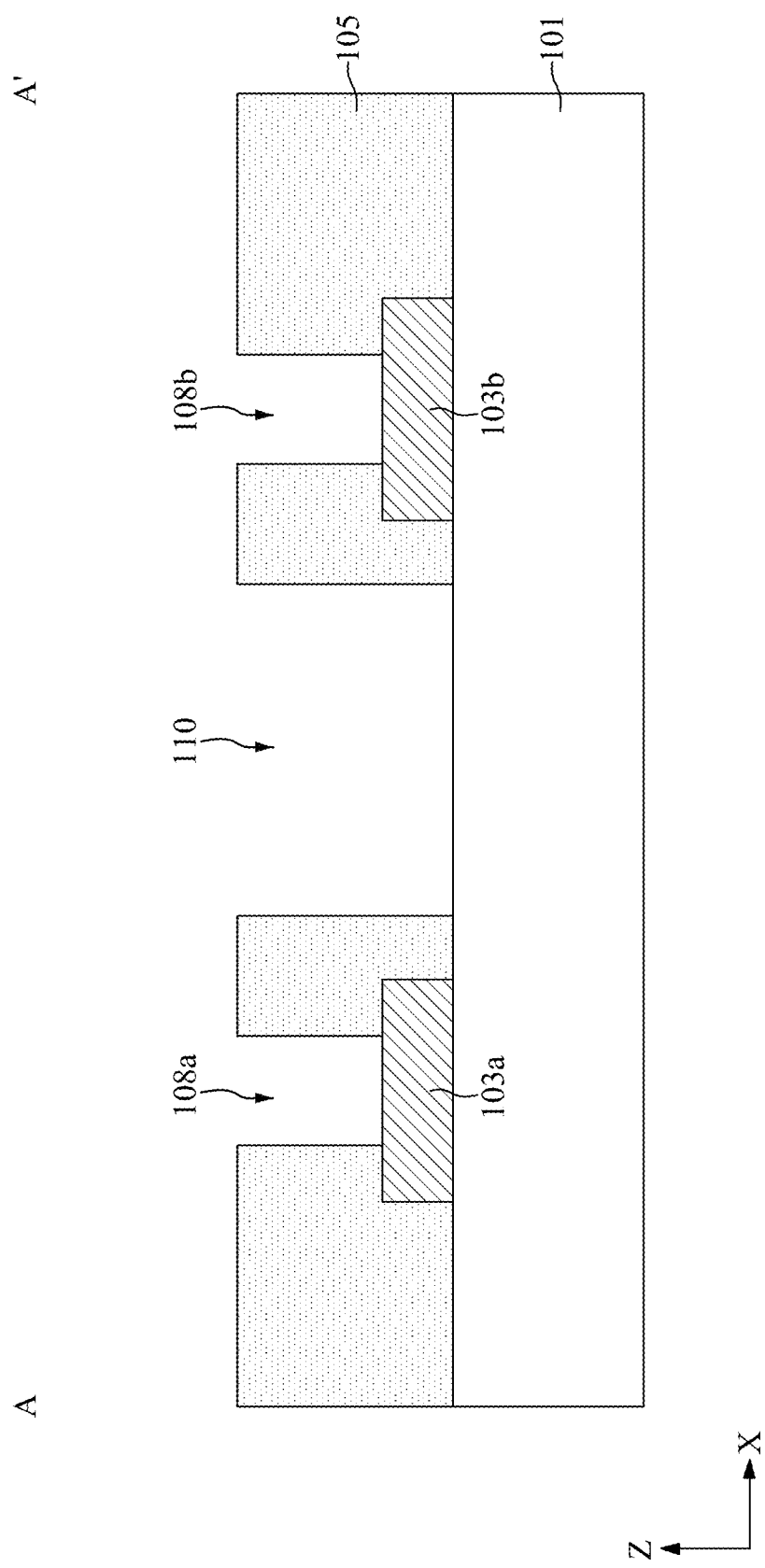
FIG. 11 is a cross-sectional view taken along the sectional line A-A' in FIG. 10, in accordance with some embodiments.

Subsequently, openings 108*a*, 108*b*, and 110 are formed in the dielectric layer 105, as shown in FIGS. 10 and 11 in accordance with some embodiments. In some embodiments, the openings 108*a*, 108*b*, and 110 are formed by performing an etching process on the dielectric layer 105. The respective step is illustrated as the step S15 in the method 10 shown in FIG. 5. In some embodiments, the openings 108*a*, 108*b*, and 110 are separated from each other.

The formation of the openings 108*a*, 108*b*, and 110 may include forming a patterned mask (not shown) over the dielectric layer 105, and transferring the pattern of the patterned mask to the dielectric layer 105 by an etching process, such as a wet etching process. After the etching process, the patterned mask may be removed. The interconnect portions 103*a* and 103*b*, and the semiconductor substrate 101 may serve as etch stop layers for the etching process used to form the openings 108*a*, 108*b* and 110. In some embodiments, the top surface of the interconnect portion 103*a* is partially exposed by the opening 108*a*, the top surface of the interconnect portion 103*b* is partially exposed by the opening 108*b*, and the top surface of the semiconductor substrate 101 is partially exposed by the opening 110.

Figure 12:
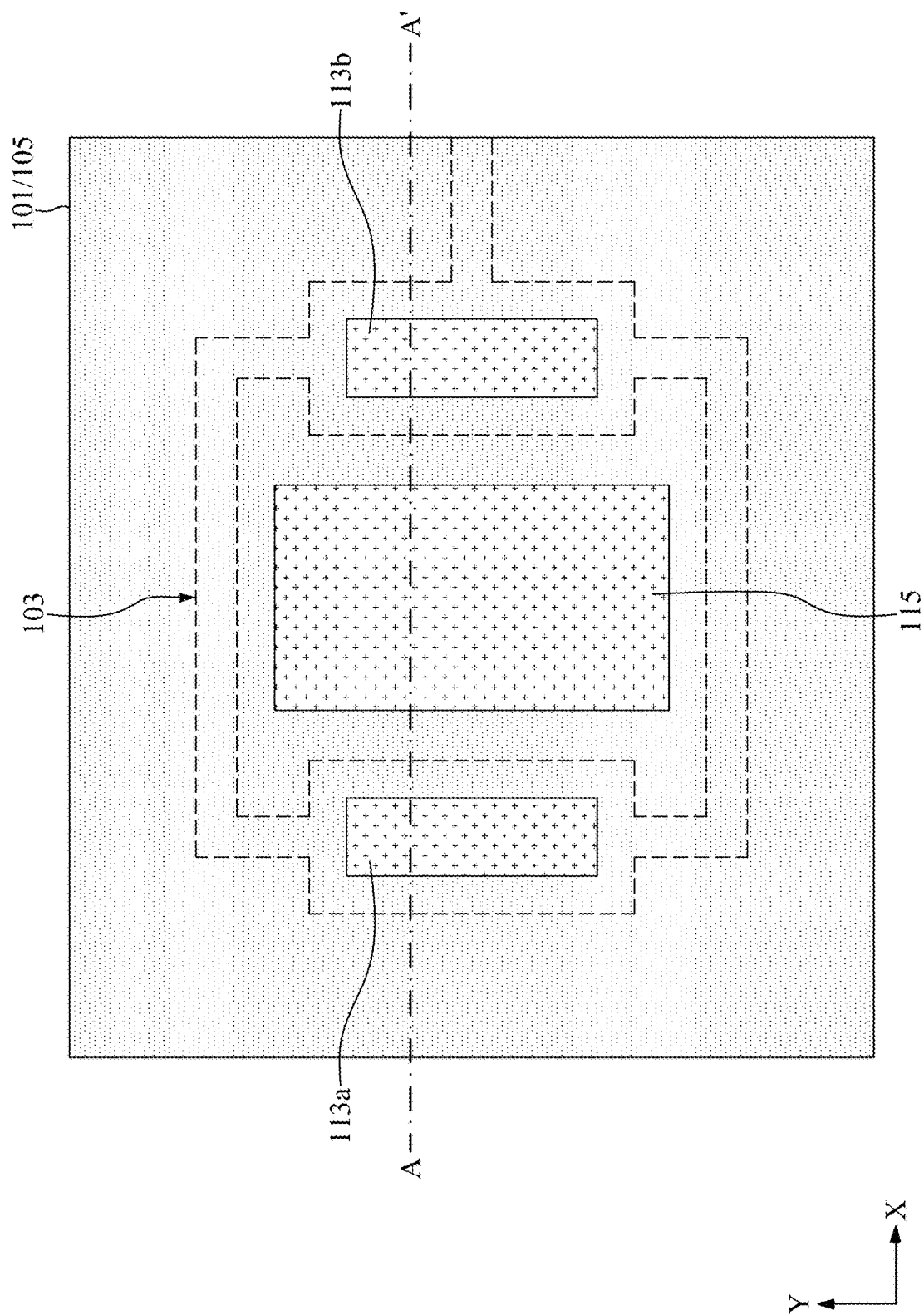
FIG. 12 is a top view illustrating an intermediate stage of filling the openings with porous dielectric portions during the formation of the semiconductor device, in accordance with some embodiments.
Figure 13:
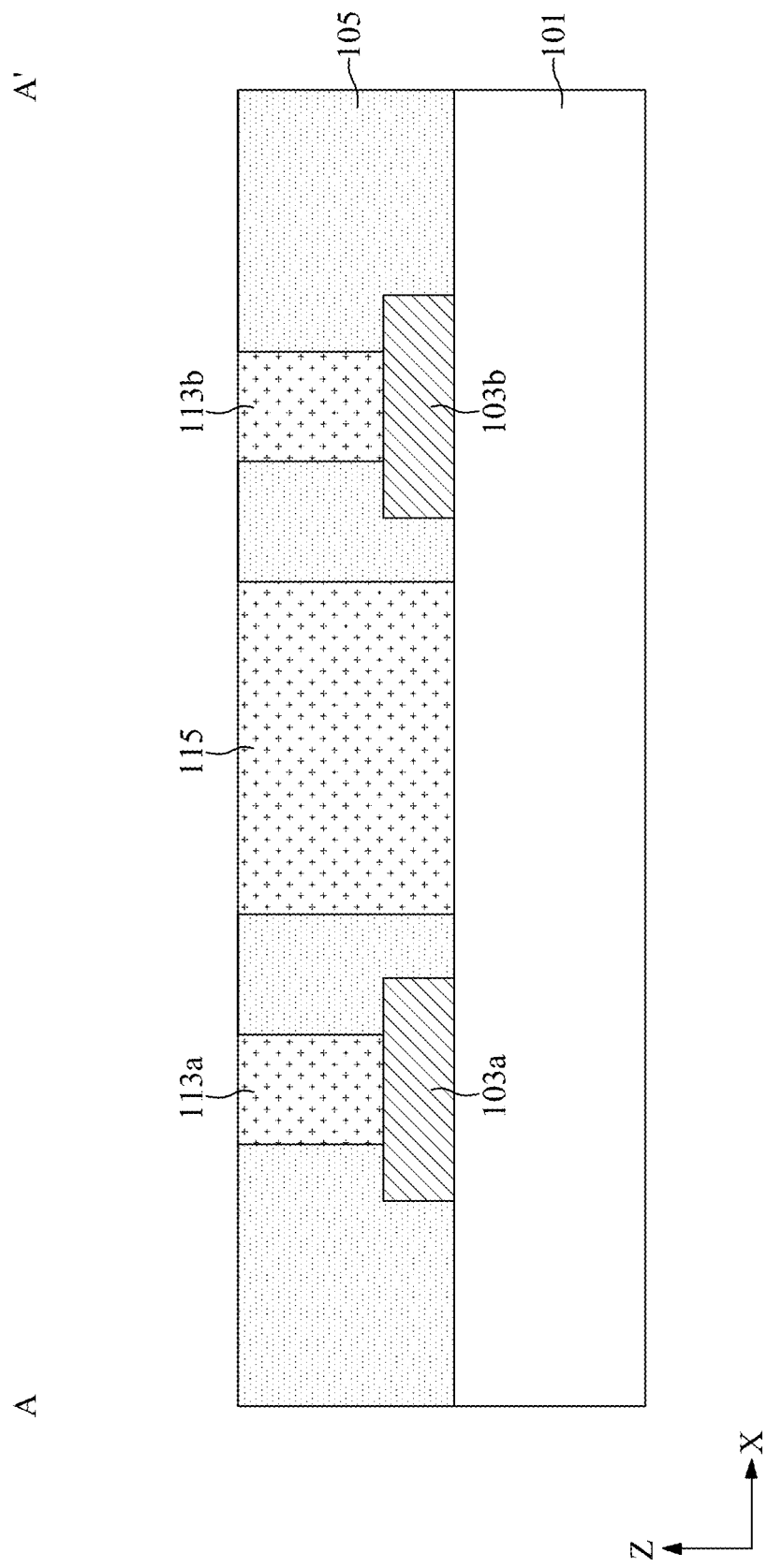
FIG. 13 is a cross-sectional view taken along the sectional line A-A' in FIG. 12, in accordance with some embodiments.

Then, the openings 108*a*, 108*b*, and 110 are filled by the porous dielectric portions 113*a*, 113*b*, and 115, respectively, as shown in FIGS. 12 and 13 in accordance with some embodiments. The respective step is illustrated as the step S17 in the method 10 shown in FIG. 5. In some embodiments, the porous dielectric portions 113*a*, 113*b*, and 115 are separated from each other.

In some embodiments, the porous dielectric portions 113*a*, 113*b*, and 115 are formed by the same porous low-k dielectric material, such as silicon oxide, silicon nitride, silicon oxynitride, or another suitable low-k material. The dielectric constants (k values) of the low-k dielectric materials may be lower than about 3.0, for example. In some embodiments, the porous dielectric portions 113*a*, 113*b*, and 115 are formed by a deposition process and a subsequent planarization process.

For example, the porous dielectric portions 113*a*, 113*b*, and 115 are formed by depositing a porous dielectric material (not shown) to fill the openings 108*a*, 108*b*, and 110 and over the dielectric layer 105, and planarizing the porous dielectric material to remove excess portions of the porous dielectric material over the top surface of the dielectric layer 105. The deposition process may include a CVD process, a PVD process, an ALD process, a spin-coating process, or another suitable process, and the planarization process may be a chemical mechanical polishing (CMP) process.

Figure 14:
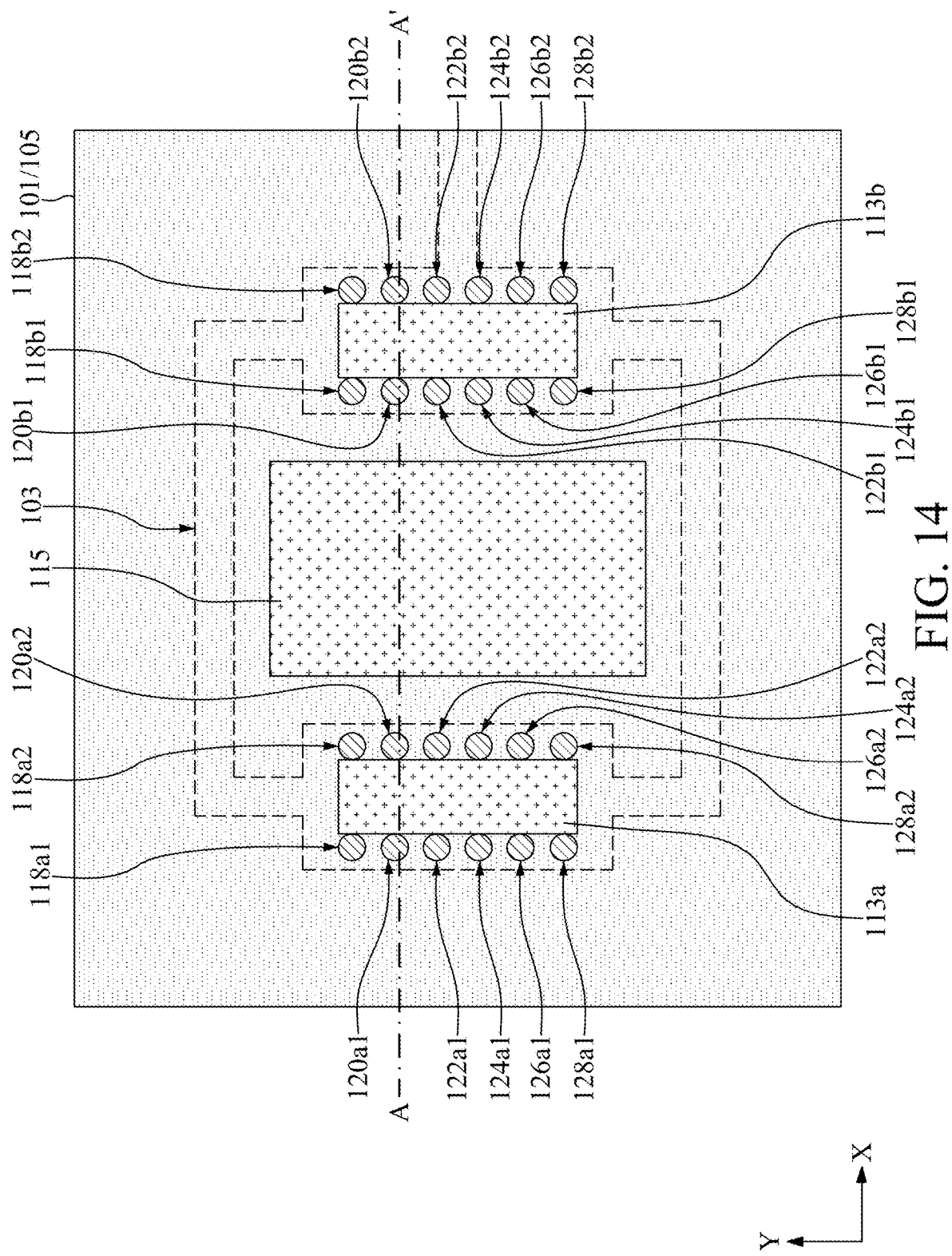
FIG. 14 is a top view illustrating an intermediate stage of etching the dielectric layer to form via holes during the formation of the semiconductor device, in accordance with some embodiments.
Figure 15:
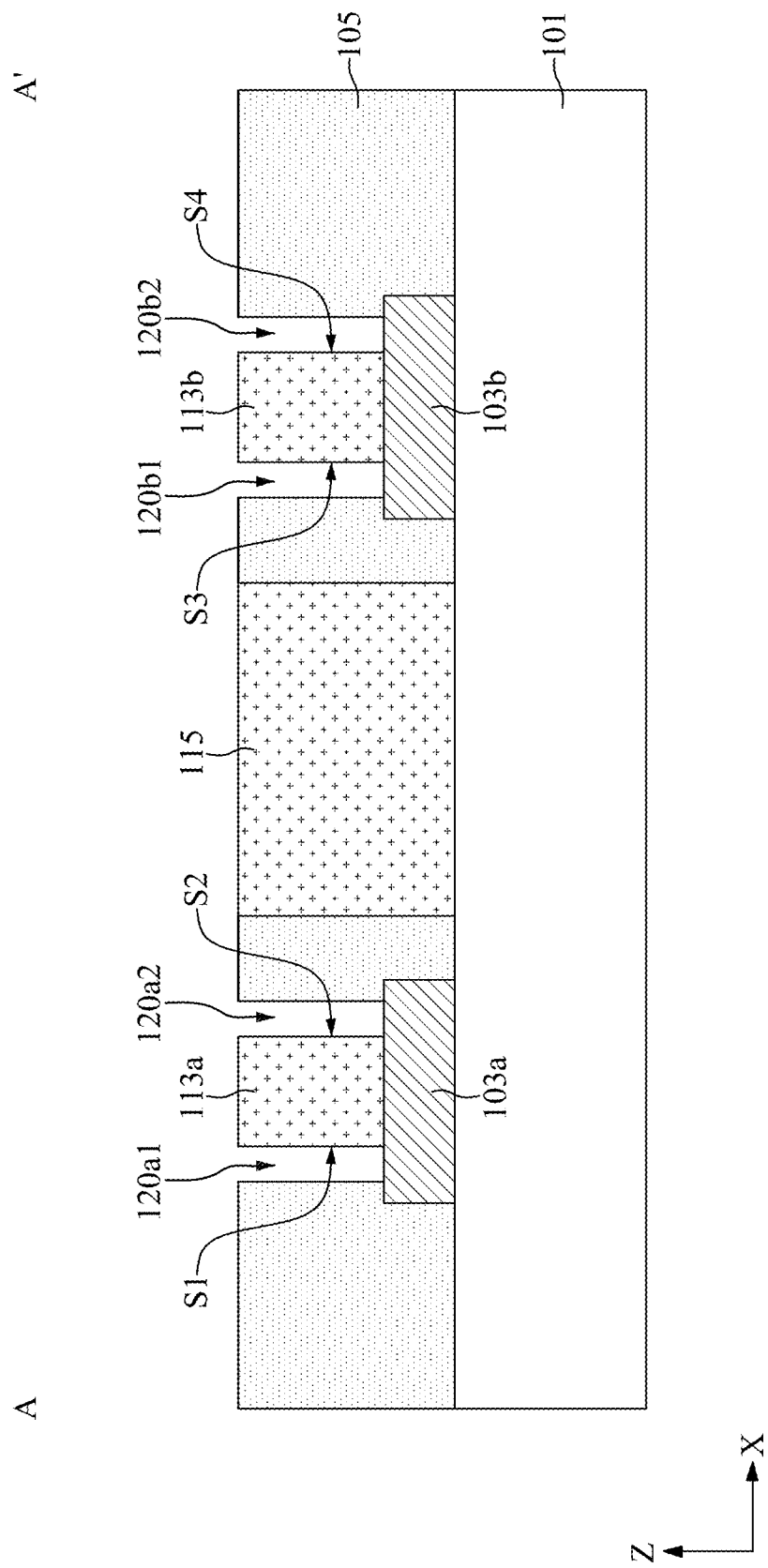
FIG. 15 is a cross-sectional view taken along the sectional line A-A' in FIG. 14, in accordance with some embodiments.

Next, via holes 118*a*1, 118*a*2, 118*b*1, 118*b*2, 120*a*1, 120*a*2, 120*b*1, 120*b*2, 122*a*1, 122*a*2, 122*b*1, 122*b*2, 124*a*1, 124*a*2, 124*b*1, 124*b*2, 126*a*1, 126*a*2, 126*b*1, 126*b*2, 128*a*1, 128*a*2, 128*b*1, and 128*b*2 are formed in the dielectric layer 105, as shown in FIGS. 14 and 15 in accordance with some embodiments. In some embodiments, the via holes 118*a*1, 118*a*2, 118*b*1, 118*b*2, 120*a*1, 120*a*2, 120*b*1, 120*b*2, 122*a*1, 122*a*2, 122*b*1, 122*b*2, 124*a*1, 124*a*2, 124*b*1, 124*b*2, 126*a*1, 126*a*2, 126*b*1, 126*b*2, 128*a*1, 128*a*2, 128*b*1, and 128*b*2 are formed by performing an etching process on the dielectric layer 105. The respective step is illustrated as the step S19 in the method 10 shown in FIG. 5.

In some embodiments, the via holes 118*a*1, 118*a*2, 118*b*1, 118*b*2, 120*a*1, 120*a*2, 120*b*1, 120*b*2, 122*a*1, 122*a*2, 122*b*1, 122*b*2, 124*a*1, 124*a*2, 124*b*1, 124*b*2, 126*a*1, 126*a*2, 126*b*1, 126*b*2, 128*a*1, 128*a*2, 128*b*1, and 128*b*2 are separated from each other. In some embodiments, the via holes 118*a*1, 118*a*2, 120*a*1, 120*a*2, 122*a*1, 122*a*2, 124*a*1, 124*a*2, 126*a*1, 126*a*2, 128*a*1, and 128*a*2 are formed over the interconnect portion 103*a*, and the via holes 118*b*1, 118*b*2, 120*b*1, 120*b*2, 122*b*1, 122*b*2, 124*b*1, 124*b*2, 126*b*1, 126*b*2, 128*b*1, and 128*b*2 are formed over the interconnect portion 103*b*. In some embodiments, the top surface of the interconnect portion 103*a* is partially exposed by the via holes 118*a*1, 118*a*2, 120*a*1, 120*a*2, 122*a*1, 122*a*2, 124*a*1, 124*a*2, 126*a*1, 126*a*2, 128*a*1, and 128*a*2, and the top surface of the interconnect portion 103*b* is partially exposed by the via holes 118*b*1, 118*b*2, 120*b*1, 120*b*2, 122*b*1, 122*b*2, 124*b*1, 124*b*2, 126*b*1, 126*b*2, 128*b*1, and 128*b*2.

In some embodiments, the porous dielectric portion 113*a* has opposite sidewalls S1 and S2, the sidewall S1 of the porous dielectric portion 113*a* is partially exposed by the via holes 118*a*1, 120*a*1, 122*a*1, 124*a*1, 126*a*1, and 128*a*1, and the sidewall S2 of the porous dielectric portion 113*a* is partially exposed by the via holes 118*a*2, 120*a*2, 122*a*2, 124*a*2, 126*a*2, and 128*a*2. In some embodiments, the porous dielectric portion 113*b* has opposite sidewalls S3 and S4, the sidewall S3 of the porous dielectric portion 113*b* is partially exposed by the via holes 118*b*1, 120*b*1, 122*b*1, 124*b*1, 126*b*1, and 128*b*1, and the sidewall S4 of the porous dielectric portion 113*b* is partially exposed by the via holes 118*b*2, 120*b*2, 122*b*2, 124*b*2, 126*b*2, and 128*b*2.

The formation of the via holes 118*a*1, 118*a*2, 118*b*1, 118*b*2, 120*a*1, 120*a*2, 120*b*1, 120*b*2, 122*a*1, 122*a*2, 122*b*1, 122*b*2, 124*a*1, 124*a*2, 124*b*1, 124*b*2, 126*a*1, 126*a*2, 126*b*1, 126*b*2, 128*a*1, 128*a*2, 128*b*1, and 128*b*2 may include forming a patterned mask (not shown) over the dielectric layer 105, and transferring the pattern of the patterned mask to the dielectric layer 105 by an etching process, such as a wet etching process. After the etching process, the patterned mask may be removed.

Figure 16:
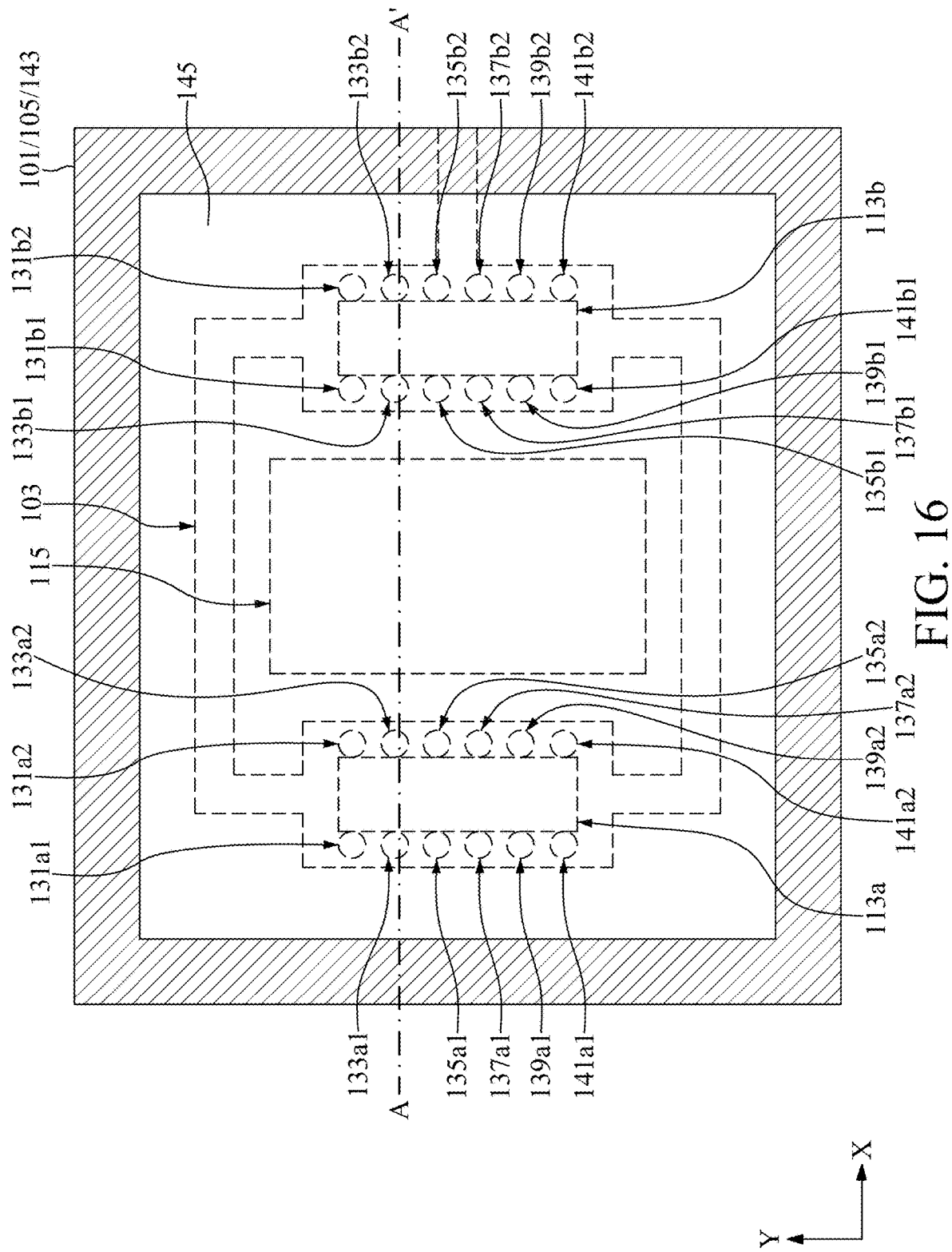
FIG. 16 is a top view illustrating an intermediate stage of filling the via holes with conductive vias and forming a conductive layer over the dielectric layer during the formation of the semiconductor device, in accordance with some embodiments.
Figure 17:
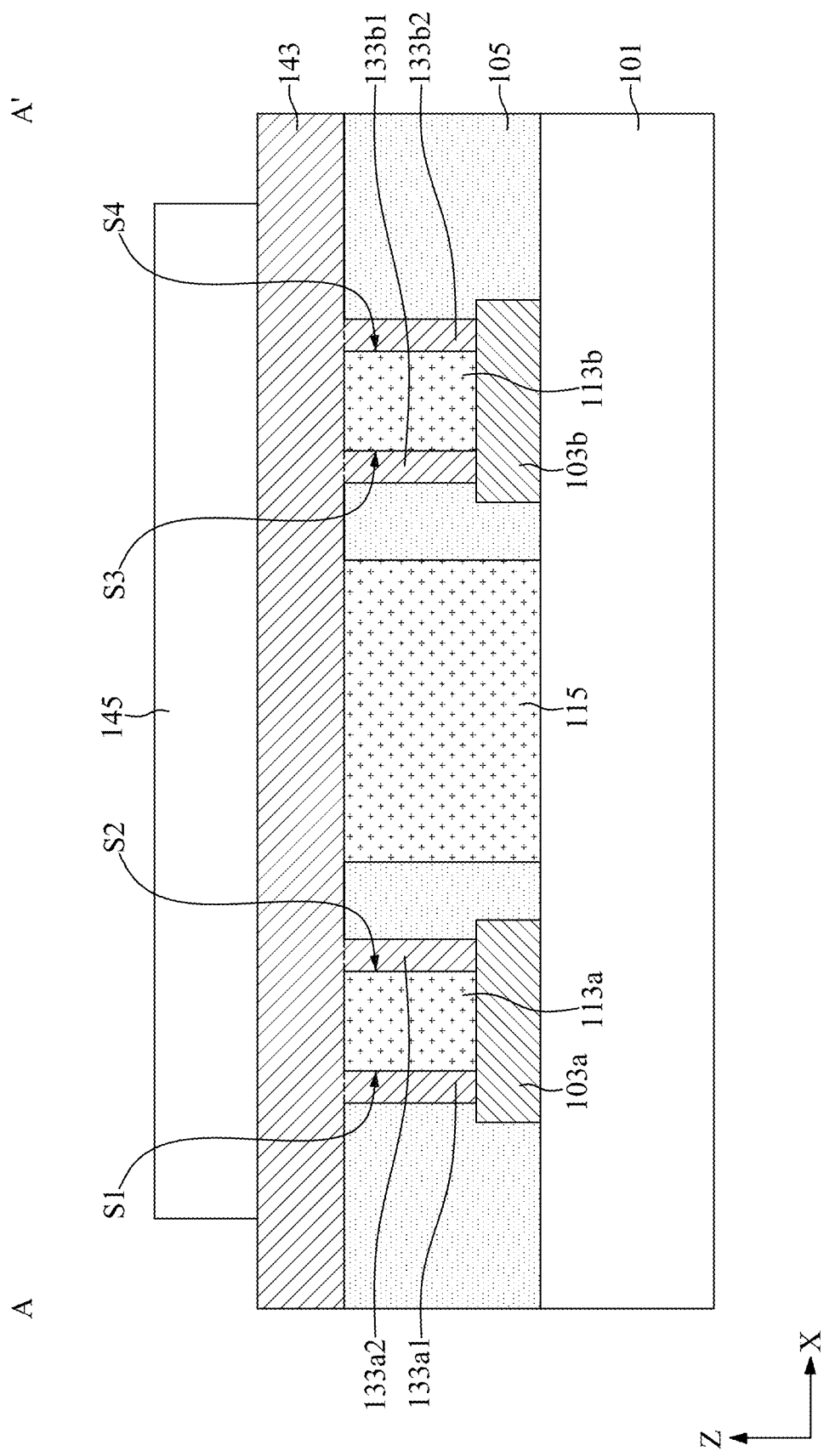
FIG. 17 is a cross-sectional view taken along the sectional line A-A' in FIG. 16, in accordance with some embodiments.

Subsequently, the via holes 118a1, 118a2, 118b1, 118b2, 120a1, 120a2, 120b1, 120b2, 122a1, 122a2, 122b1, 122b2, 124a1, 124a2, 124b1, 124b2, 126a1, 126a2, 126b1, 126b2, 128a1, 128a2, 128b1, and 128b2 are filled with conductive vias 131a1, 131a2, 131b1, 131b2, 133a1, 133a2, 133b1, 133b2, 135a1, 135a2, 135b1, 135b2, 137a1, 137a2, 137b1, 137b2, 139a1, 139a2, 139b1, 139b2, 141a1, 141a2, 141b1, and 141b2, respectively, and a conductive layer 143 is formed over the dielectric layer 105, as shown in FIGS. 16 and 17 in accordance with some embodiments.

In some embodiments, the conductive vias 131a1, 131a2, 131b1, 131b2, 133a1, 133a2, 133b1, 133b2, 135a1, 135a2, 135b1, 135b2, 137a1, 137a2, 137b1, 137b2, 139a1, 139a2, 139b1, 139b2, 141a1, 141a2, 141b1, 141b2 and the conductive layer 143 are formed from the same material(s) with the same process step(s). For example, a conductive material (not shown) is formed to fill the via holes 118a1, 118a2, 118b1, 118b2, 120a1, 120a2, 120b1, 120b2, 122a1, 122a2, 122b1, 122b2, 124a1, 124a2, 124b1, 124b2, 126a1, 126a2, 126b1, 126b2, 128a1, 128a2, 128b1, and 128b2 and over the top surface of the dielectric layer 105 by a deposition process. Moreover, the conductive vias 131a1, 131a2, 131b1, 131b2, 133a1, 133a2, 133b1, 133b2, 135a1, 135a2, 135b1, 135b2, 137a1, 137a2, 137b1, 137b2, 139a1, 139a2, 139b1, 139b2, 141a1, 141a2, 141b1, 141b2 and the conductive layer 143 may include a single layer structure or a multi-layer structure. In this case, multiple deposition processes may be performed.

In some embodiments, the conductive vias 131a1, 131a2, 131b1, 131b2, 133a1, 133a2, 133b1, 133b2, 135a1, 135a2, 135b1, 135b2, 137a1, 137a2, 137b1, 137b2, 139a1, 139a2, 139b1, 139b2, 141a1, 141a2, 141b1, 141b2 and the conductive layer 143 include a conductive material, such as copper (Cu), aluminum (Al), tungsten (W), titanium (Ti), titanium nitride (TiN), tantalum (Ta), tantalum nitride (TaN), or another suitable material. In some embodiments, the conductive vias 131a1, 133a1, 135a1, 137a1, 139a1, and 141a1 are in direct contact with the sidewall S1 of the porous dielectric portion 113a, and the conductive vias 131a2, 133a2, 135a2, 137a2, 139a2, and 141a2 are in direct contact with the sidewall S2 of the porous dielectric portion 113a. In some embodiments, the conductive vias 131b1, 133b1, 135b1, 137b1, 139b1, and 141b1 are in direct contact with the sidewall S3 of the porous dielectric portion 113b, and the conductive vias 131b2, 133b2, 135b2, 137b2, 139b2, and 141b2 are in direct contact with the sidewall S4 of the porous dielectric portion 113b.

After the conductive vias 131a1, 131a2, 131b1, 131b2, 133a1, 133a2, 133b1, 133b2, 135a1, 135a2, 135b1, 135b2, 137a1, 137a2, 137b1, 137b2, 139a1, 139a2, 139b1, 139b2, 141a1, 141a2, 141b1, 141b2 and the conductive layer 143 are formed, a patterned mask 145 used to define the edges of the subsequently formed bonding pad is formed over the conductive layer 143, in accordance with some embodiments. In some embodiments, the top surface of the conductive layer 143 is partially exposed by the patterned mask 145.

Figure 18:
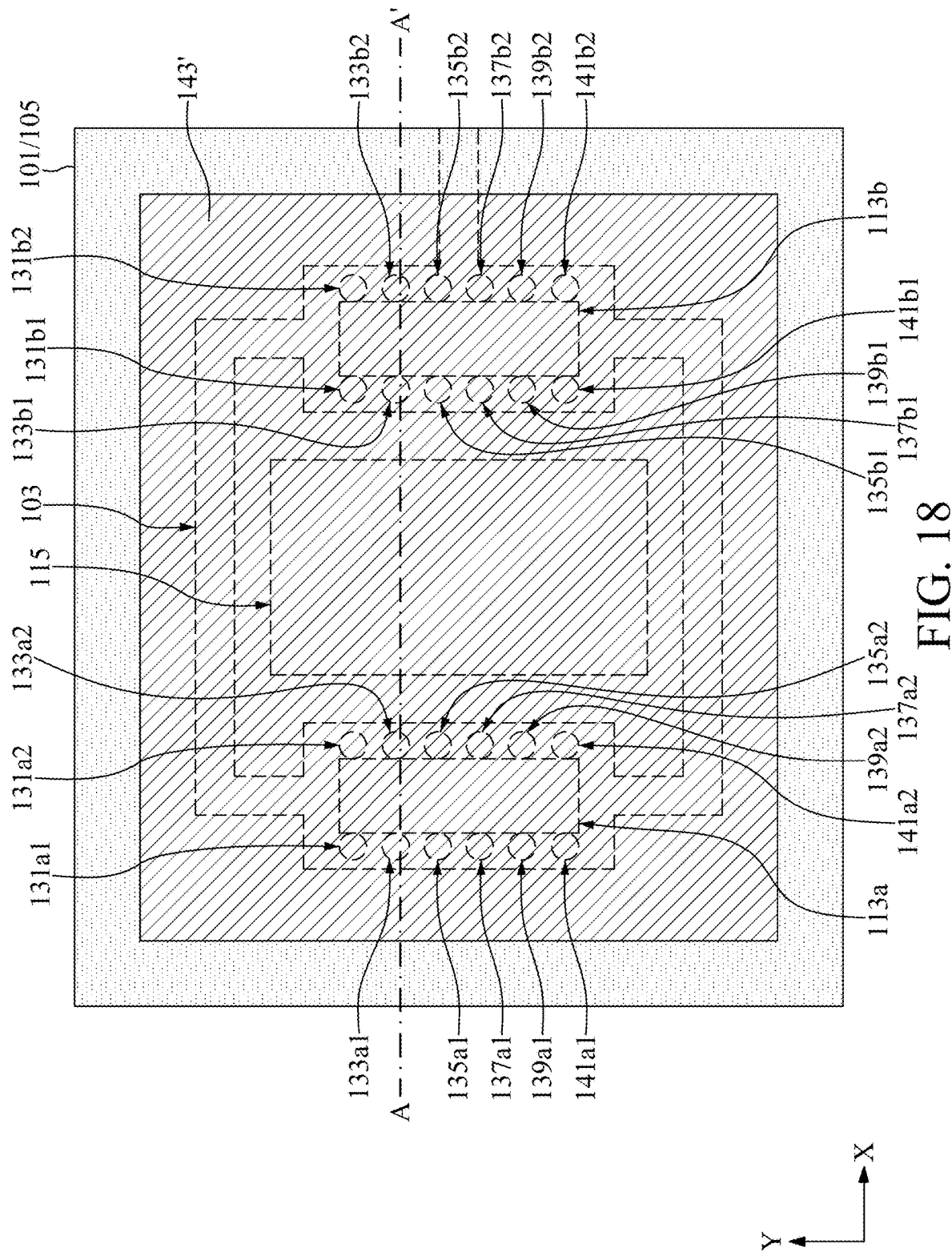
FIG. 18 is a top view illustrating an intermediate stage of etching the conductive layer to form a bonding pad during the formation of the semiconductor device, in accordance with some embodiments.
Figure 19:
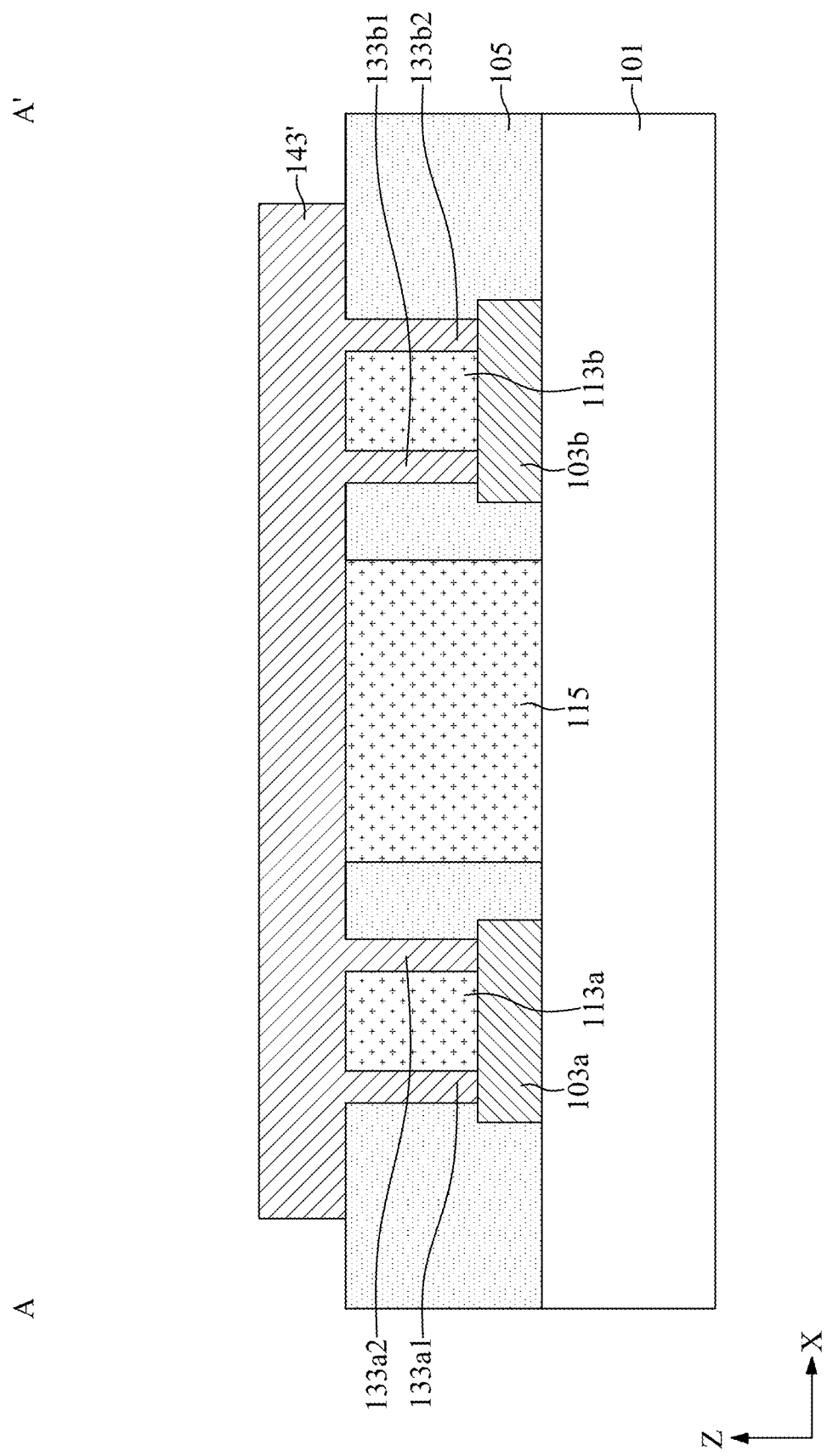
FIG. 19 is a cross-sectional view taken along the sectional line A-A' in FIG. 18, in accordance with some embodiments.

Then, an etching process is performed on the conductive layer 143 using the patterned mask 145 as a mask, such that a bonding pad 143' is obtained, as shown in FIGS. 18 and 19 in accordance with some embodiments. In some embodiments, the etching process includes a wet etching process, a dry etching process, or a combination thereof. After the etching process, the top surface of the dielectric layer 105 is partially exposed, and the patterned mask 145 (see FIGS. 16 and 17) may be removed. The respective step is illustrated as the step S21 in the method 10 shown in FIG. 5.

Figure 20:
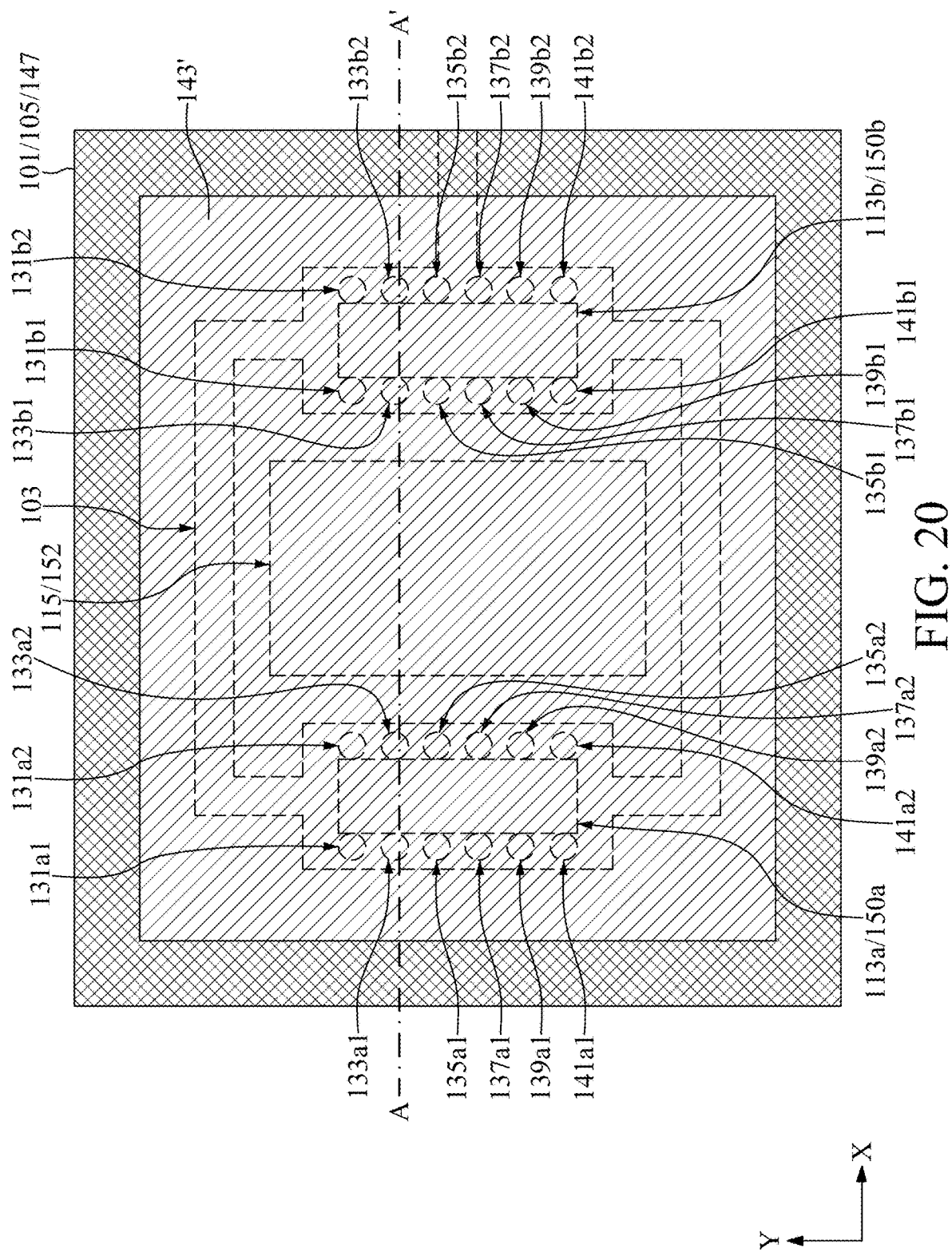
FIG. 20 is a top view illustrating an intermediate stage of forming a molding layer surrounding the bonding pad and forming air gaps between the bonding pad and the porous dielectric portions during the formation of the semiconductor device, in accordance with some embodiments.
Figure 21:
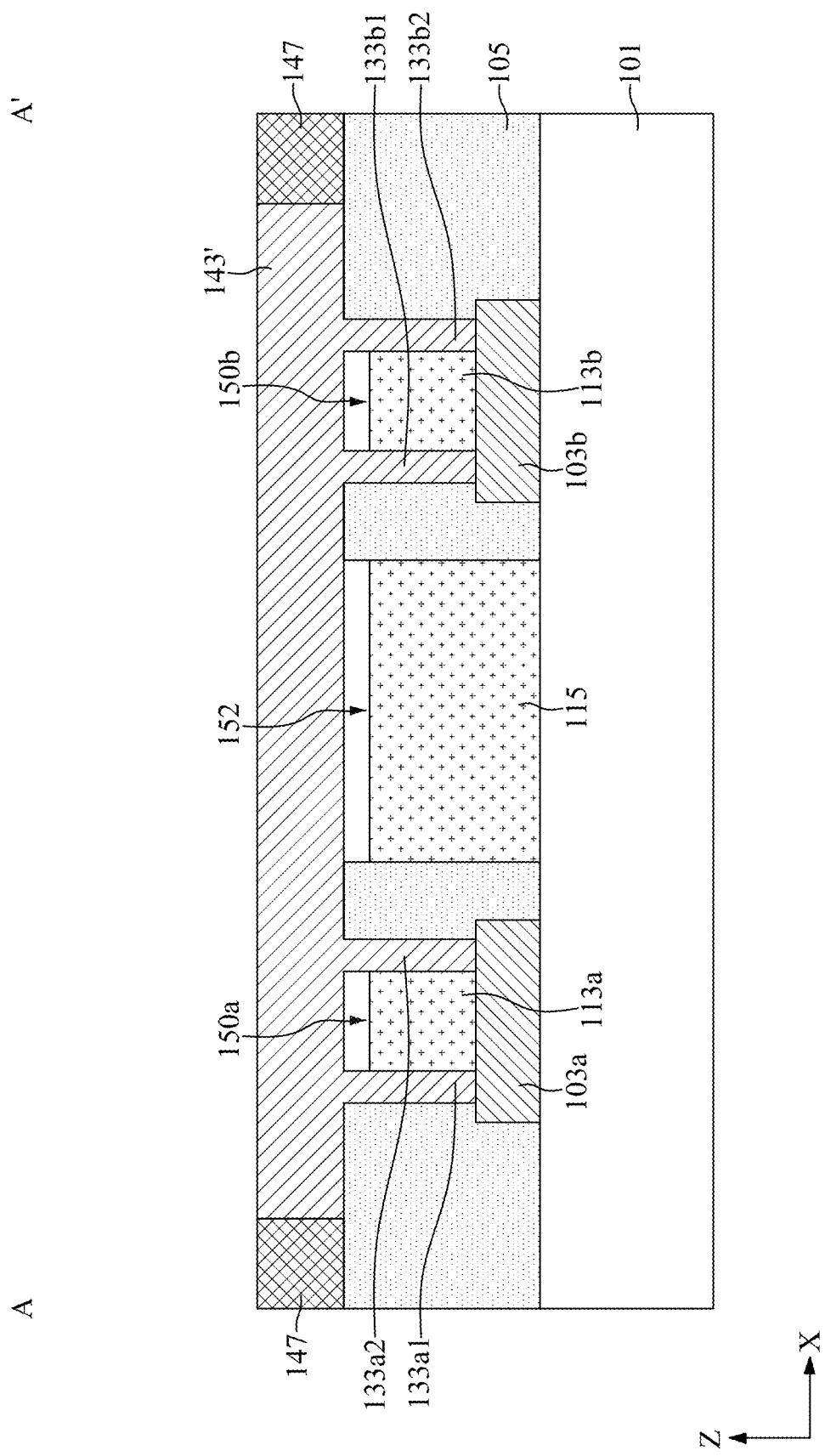
FIG. 21 is a cross-sectional view taken along the sectional line A-A' in FIG. 20, in accordance with some embodiments.

Next, a molding layer 147 is formed over the dielectric layer 105 and surrounding the bonding pad 143', as shown in FIGS. 20 and 21 in accordance with some embodiments. In some embodiments, the molding layer 147 includes an epoxy, an organic polymer, a polymer with or without a silica-based or glass filled added, a polyamide, or other materials. In some embodiments, the molding layer 147 is formed by a molding process and a subsequent heat treatment process (e.g., a curing process).

In some embodiments, the molding process includes a compressive molding process, a transfer molding process, or another suitable molding process. In some embodiments, during the heat treatment process for forming the molding layer 147, air gaps 150a, 150b, and 152 are formed between the bonding pad 143' and the porous dielectric portions 113a, 113b, and 115. The respective step is illustrated as the step S23 in the method 10 shown in FIG. 5.

In some embodiments, the porous dielectric portion 113a is separated from the bonding pad 143' by the air gap 150a between them. In some embodiments, the porous dielectric portion 113b is separated from the bonding pad 143' by the air gap 150b between them. Moreover, in some embodiments, the porous dielectric portion 115 is separated from the bonding pad 143' by the air gap 152 between them.

Figure 22:
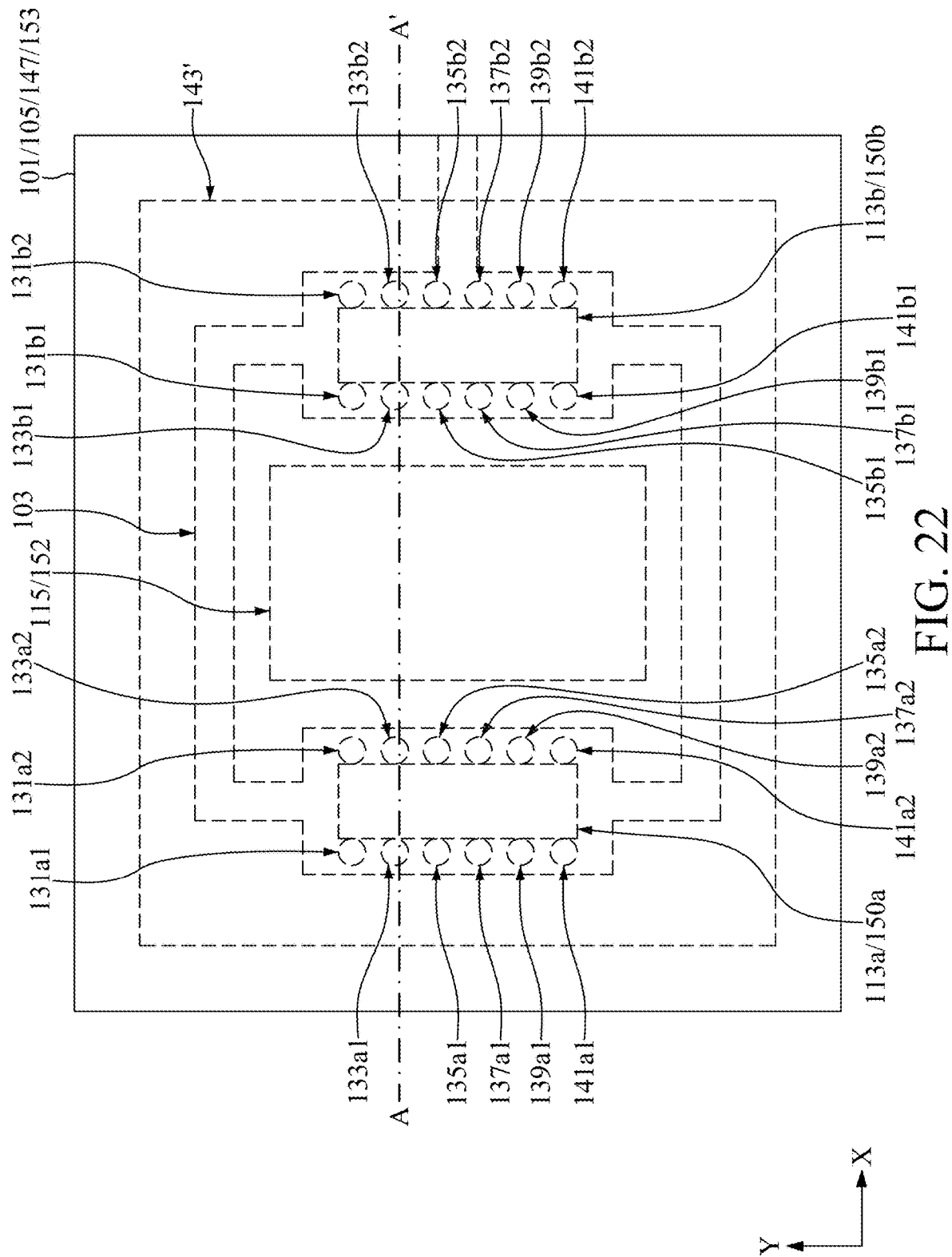
FIG. 22 is a top view illustrating an intermediate stage of forming a passivation layer over the bonding pad during the formation of the semiconductor device, in accordance with some embodiments.
Figure 23:
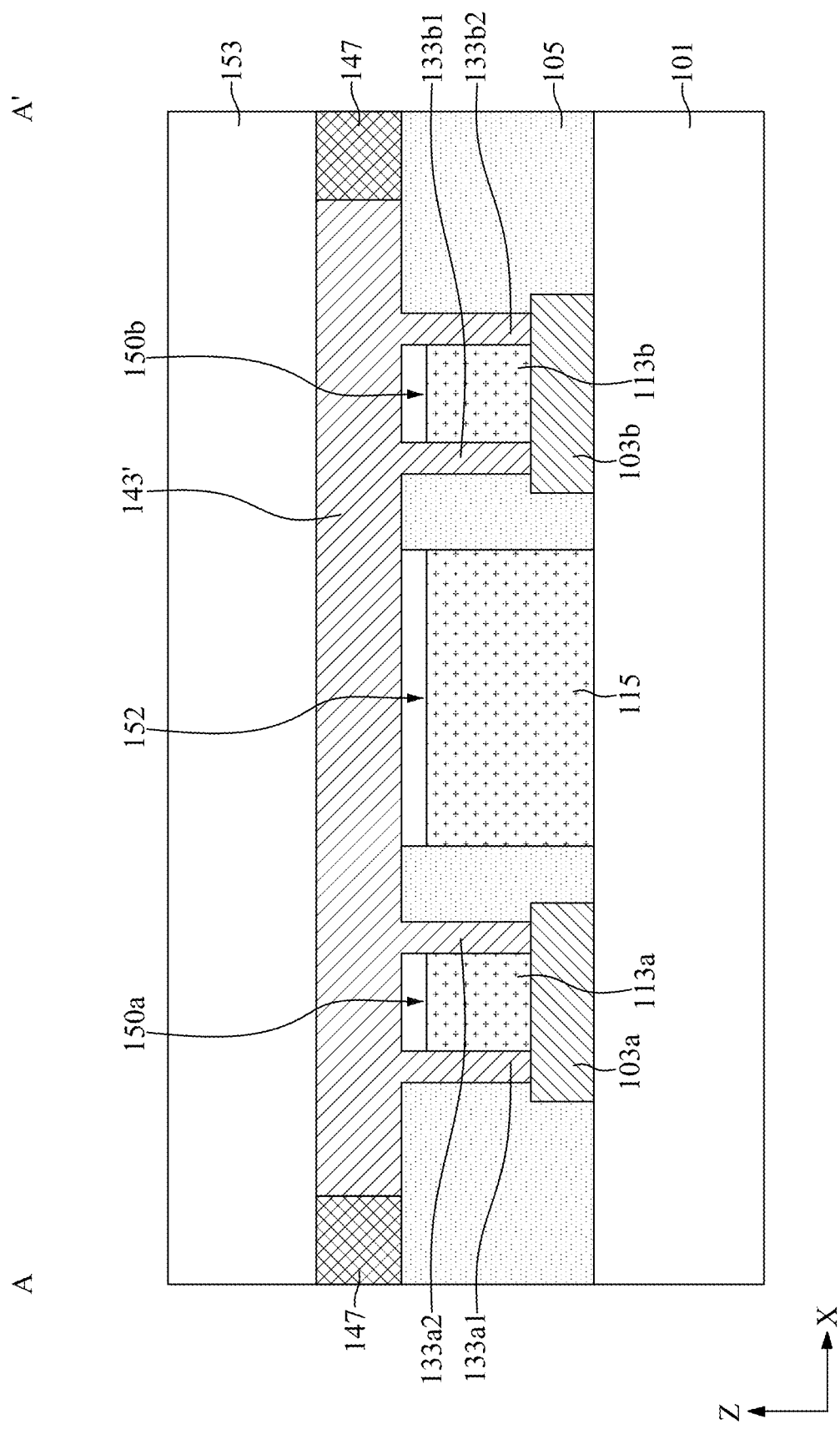
FIG. 23 is a cross-sectional view taken along the sectional line A-A' in FIG. 22, in accordance with some embodiments.

Subsequently, a passivation layer 153 is formed over the bonding pad 143' and the molding layer 147, as shown in FIGS. 22 and 23 in accordance with some embodiments. The respective step is illustrated as the step S25 in the method 10 shown in FIG. 5. In some embodiments, the passivation layer 153 includes a dielectric material, such as undoped silicate glass (USG), silicon nitride, silicon oxide, silicon oxynitride or a non-porous material. The passivation layer 153 may be formed by a deposition process, such as a CVD process, a PVD process, an ALD process, a spin-coating process, or another suitable process.

After the passivation layer 153 is formed, an opening 156 is formed penetrating through the passivation layer 153 to expose the bonding pad 143', as shown in FIGS. 1 and 2 in accordance with some embodiments. The respective step is illustrated as the step S27 in the method 10 shown in FIG. 5. The formation of the opening 156 may include forming a patterned mask (not shown) over the passivation layer 153, and transferring the pattern of the patterned mask to the passivation layer 153 by an etching process, such as a wet etching process.

After the etching process for forming the opening 156, the patterned mask may be removed, and the semiconductor device 100 is obtained. In some embodiments, the remaining portion of the passivation layer 153 covers the peripheral portion of the bonding pad 143', and the central portion of the bonding pad 143' is exposed through the opening 156, in accordance with some embodiments.

In some embodiments, a bonding process is performed to attach a wire bond 161 to the bonding pad 143' of the semiconductor device 100 through the opening 156 in the passivation layer 153, as shown in FIGS. 3 and 4 in accordance with some embodiments. The semiconductor device 100 with the wire bond 161 refers to the semiconductor device 100'. The respective step is illustrated as the step S29 in the method 10 shown in FIG. 5. In the present embodiment, a portion of the bonding pad 143' is pushed downwardly during the bonding process, such that a protruding portion 143p extending from the bonding pad 143' to the porous dielectric portion 115 is obtained. However, in alternative embodiments, the protruding portion 143p may not be formed.

Embodiments of a semiconductor device with an air gap and method for preparing the same are provided in the disclosure. The semiconductor device includes an interconnect structure (e.g., the interconnect structure 103) and porous dielectric portions (e.g., the porous dielectric portions 113a, 113b, and 115) disposed over a semiconductor substrate (e.g., the semiconductor substrate 101). The semiconductor device also includes a bonding pad (e.g., the bonding pad 143'), and the porous dielectric portions are disposed between the bonding pad and the interconnect structure. In some embodiments, the bonding pad is separated from the porous dielectric portions by air gaps (e.g., the air gaps 150a, 150b, and 152), and a wire bond (e.g., the wire bond 161) is attached to the bonding pad by a bonding process. During the bonding process, the air gaps act as a cushion to reduce the impact of the stress from the wire bond on the underlying structure. As a result, the performance, reliability and yield of the semiconductor device can be improved.

In one embodiment of the present disclosure, a semiconductor device is provided. The semiconductor device includes an interconnect structure disposed over a semiconductor substrate. The interconnect structure includes a first interconnect portion and a second interconnect portion. The semiconductor device also includes a first porous dielectric portion disposed between the first interconnect portion and the second interconnect portion, and a dielectric layer surrounding the first porous dielectric portion. The semiconductor device further includes a bonding pad disposed over the dielectric layer and the first porous dielectric portion. The bonding pad and the first porous dielectric portion are separated by a first air gap.

In another embodiment of the present disclosure, a semiconductor device is provided. The semiconductor device includes an interconnect structure disposed over a semiconductor substrate. The interconnect structure includes a first interconnect portion and a second interconnect portion. The semiconductor device also includes a first porous dielectric portion disposed over and in direct contact with the first interconnect portion of the interconnect structure, and a dielectric layer surrounding the first porous dielectric portion and covering the interconnect structure. The semiconductor device further includes a bonding pad disposed over the dielectric layer and the first porous dielectric portion. The bonding pad and the first porous dielectric portion of the interconnect structure are separated by a first air gap.

In yet another embodiment of the present disclosure, a method for forming a semiconductor device is provided. The method includes forming an interconnect structure over a semiconductor substrate. The interconnect structure includes a first interconnect portion and a second interconnect portion. The method also includes forming a dielectric layer over the semiconductor substrate and covering the interconnect structure, and forming a first opening penetrating through the dielectric layer. The first opening is between the first interconnect portion and the second interconnect portion of the interconnect structure. The method further includes filling the first opening with a first porous dielectric portion, and forming a bonding pad over the dielectric layer and the first porous dielectric portion. In addition, the method includes performing a heat treatment process to form a first air gap between the first porous dielectric portion and the bonding pad.

The embodiments of the present disclosure have some advantageous features. By forming a porous dielectric portion over a semiconductor substrate and forming a bonding pad over the porous dielectric portion, an air gap is formed between the porous dielectric portion and the bonding pad in subsequent heat treatment process (e.g., the curing process performed during the formation of the molding layer). Since the air gap provides an adequate cushion for the semiconductor structure during subsequent bonding process, the performance, reliability and yield of the semiconductor device can be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
  an interconnect structure disposed over a semiconductor substrate, wherein the interconnect structure comprises a first interconnect portion and a second interconnect portion;
  a first porous dielectric portion disposed between the first interconnect portion and the second interconnect portion;
  a dielectric layer surrounding the first porous dielectric portion; and
  a bonding pad disposed over the dielectric layer and the first porous dielectric portion, wherein the bonding pad and the first porous dielectric portion are separated by a first air gap;
  wherein a top surface of the dielectric layer is higher than a top surface of the first porous dielectric portion.

2. The semiconductor device of claim 1, wherein a top surface of the first porous dielectric portion is higher than a top surface of the first interconnect portion and a top surface of the second interconnect portion.

3. The semiconductor device of claim 1, further comprising:
  a second porous dielectric portion disposed over the first interconnect portion, wherein the bonding pad and the second porous dielectric portion are separated by a second air gap; and
  a first conductive via and a second conductive via disposed between and electrically connecting the bonding pad and the first interconnect portion, wherein the second porous dielectric portion is disposed between the first conductive via and the second conductive via.

4. The semiconductor device of claim 3, further comprising:

a third porous dielectric portion disposed over the second interconnect portion, wherein the bonding pad and the third porous dielectric portion are separated by a third air gap; and a third conductive via and a fourth conductive via disposed between and electrically connecting the bonding pad and the second interconnect portion, wherein the third porous dielectric portion is disposed between the third conductive via and the fourth conductive via.

5. The semiconductor device of claim 1, further comprising:

a passivation layer disposed over the bonding pad, wherein the bonding pad is partially exposed by an opening in the passivation layer;

wherein the opening in the passivation layer overlaps the first air gap in a top view, and the passivation layer does not overlap the first air gap in the top view.

6. A semiconductor device, comprising:

an interconnect structure disposed over a semiconductor substrate, wherein the interconnect structure comprises a first interconnect portion and a second interconnect portion;

a first porous dielectric portion disposed over and in direct contact with the first interconnect portion of the interconnect structure;

a dielectric layer surrounding the first porous dielectric portion and covering the interconnect structure; and a bonding pad disposed over the dielectric layer and the first porous dielectric portion, wherein the bonding pad and the first porous dielectric portion of the interconnect structure are separated by a first air gap.

7. The semiconductor device of claim 6, wherein a top surface of the dielectric layer is higher than a top surface of the first porous dielectric portion, and the bonding pad is in direct contact with the top surface of the dielectric layer.

8. The semiconductor device of claim 6, further comprising:

a first conductive via and a second conductive via disposed between and electrically connecting the bonding pad and the first interconnect portion of the interconnect structure, wherein the first porous dielectric portion is disposed between and in direct contact with the first conductive via and the second conductive via.

9. The semiconductor device of claim 6, further comprising:

a second porous dielectric portion disposed over and in direct contact with the second interconnect portion of the interconnect structure, wherein the bonding pad and the second porous dielectric portion of the interconnect structure are separated by a second air gap;

wherein the first porous dielectric portion is separated from the second porous dielectric portion, and the first air gap is separated from the second air gap.

10. The semiconductor device of claim 9, further comprising:

a third conductive via and a fourth conductive via disposed between and electrically connecting the bonding pad and the second interconnect portion of the interconnect structure, wherein the second porous dielectric portion is disposed between and in direct contact with the third conductive via and the fourth conductive via.

11. The semiconductor device of claim 9, further comprising:

a third porous dielectric portion surrounded by the dielectric layer, wherein the third porous dielectric portion is disposed between the first porous dielectric portion and the second porous dielectric portion, and wherein the bonding pad and the third porous dielectric portion are separated by a third air gap;

wherein the first porous dielectric portion, the second porous dielectric portion, and the third porous dielectric portion comprise a porous low-k dielectric material.

12. The semiconductor device of claim 11, further comprising:

a passivation layer disposed over the bonding pad, wherein the bonding pad is partially exposed by an opening in the passivation layer; and a wire bond physically bonded to the bonding pad through the opening, wherein the wire bond overlaps the third air gap in a top view;

wherein the bonding pad comprises a protruding portion extending toward the third porous dielectric portion.

* * * * *